(12) United States Patent
Moon et al.

(10) Patent No.: US 10,483,893 B2
(45) Date of Patent: Nov. 19, 2019

(54) MOTOR DRIVING APPARATUS AND HOME APPLIANCE INCLUDING THE SAME

(71) Applicant: LG ELECTRONICS INC., Seoul (KR)

(72) Inventors: Jungsong Moon, Seoul (KR); Taeyoung Park, Seoul (KR); Sangyoung Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 15 days.

(21) Appl. No.: 15/692,029

(22) Filed: Aug. 31, 2017

(65) Prior Publication Data
US 2018/0062551 A1 Mar. 1, 2018

(30) Foreign Application Priority Data

Aug. 31, 2016 (KR) .......................... 10-2016-0112052

(51) Int. Cl.
*H02P 21/24* (2016.01)
*H02M 7/44* (2006.01)
(Continued)

(52) U.S. Cl.
CPC .............. *H02P 21/24* (2016.02); *H02M 7/44* (2013.01); *H02M 7/5387* (2013.01);
(Continued)

(58) Field of Classification Search
CPC ............ H02P 21/12; H02P 21/24; H02M 7/44
(Continued)

(56) References Cited

U.S. PATENT DOCUMENTS

| 10,050,571 | B2 * | 8/2018 | Jang | ...................... D06F 37/304 |
| 2014/0101865 | A1 * | 4/2014 | Jang | ...................... D06F 39/003 8/137 |
| 2018/0034364 | A1 * | 2/2018 | Nakada | ................... H02M 3/07 |

FOREIGN PATENT DOCUMENTS

| CN | 103236798 | 1/2016 |
| CN | 103326603 | 5/2016 |

(Continued)

OTHER PUBLICATIONS

S.-H. Na et al: "Reduction of audible switching noise in induction motor drives using random position space vector PWM", IEE Proceedings: Electric Power Applications., vol. 149, No. 3, Jan. 1, 2002, p. 195, XP055435488.

(Continued)

*Primary Examiner* — Kawing Chan
(74) *Attorney, Agent, or Firm* — KED & Associates LLP

(57) ABSTRACT

The present disclosure relates to a motor driving apparatus and a home appliance including the same. The motor driving apparatus in accordance with an embodiment of the present disclosure, comprises a DC-stage capacitor, a three-phase upper arm and lower arm switching element, an inverter to convert DC power from the DC-stage capacitor to an AC power by a switching operation and output the converted AC power to a motor, and a controller to control the inverter, wherein the controller controls the switching elements in the inverter based on a space vector-based pulse width variable, and controls a turn-on time of the switching elements to be shifted, wherein continuous first and second switching periods of the switching elements is changed to one switching period by shifting the a turn-on time of the switching elements. Accordingly, when the inverter is switched, noise can be reduced while reducing switching loss.

11 Claims, 26 Drawing Sheets

(51) Int. Cl.
*H02P 21/12* (2016.01)
*H02M 7/5387* (2007.01)
*H02M 1/00* (2006.01)

(52) U.S. Cl.
CPC ..... *H02P 21/12* (2013.01); *H02M 2001/0054* (2013.01); *H02M 2007/53876* (2013.01); *H03K 2217/0036* (2013.01); *Y02B 70/1491* (2013.01)

(58) Field of Classification Search
USPC .................................................... 318/400.26
See application file for complete search history.

(56) References Cited

FOREIGN PATENT DOCUMENTS

| | | |
|---|---|---|
| DE | 10 2012 020652 | 4/2014 |
| EP | 1 347 567 | 9/2003 |
| EP | 2 312 739 | 7/2013 |
| JP | 5660389 | 1/2015 |
| WO | WO 2013/011807 | 1/2013 |

OTHER PUBLICATIONS

Jung-Geun Kim: "A New Random PWM(SRP-PWM) Technique for Decreasing Acoustic Noise Radiated from v/f Controlled Motor Drives Jug-Gem Kim, Young-Gook Jung 2, Seok-Hwan Na3, and Young-Choel Lim4 Member, IEEE", Aug. 27, 2005, XP055435494.

M.R. Baiju et al: "Harmonic Noise Reduction in Three-level Inverter using Space Vector based Dithered Sigma Delta Modulator", 7$^{th}$ IET International Conference on Power Electronics, Machines and Drives (PEMD 2014), Jan. 1, 2014, pp. 2.6.02-2.6.02, XP055435481.

K. Sri Gowri et al: "Switching Loss Characteristics of Advanced DPWM Methods Using Space Vector Based Double Switching Clamping Sequences", 2009 IEEE Symposium on Industrial Electronics and Applications (ISIEA 2009), Oct. 4-6, 2009, Kuala Lumpar, Malaysia, pp. 818-822.

European Search Report dated Jan. 5, 2018 issued in Application No. 17188795.3.

Korean Notice of Allowance dated Feb. 20, 2018 issued in Application No. 10-2016-0112052.

\* cited by examiner

MOTOR DRIVING APPARATUS AND HOME APPLIANCE INCLUDING THE SAME

CROSS-REFERENCE TO RELATED APPLICATION

This application claims priority under 35 U.S.C. § 119 to Korean Application No. 10-2016-0112052 filed on Aug. 31, 2016, whose entire disclosure is hereby incorporated by reference.

BACKGROUND

1. Field

The present disclosure relates to a motor driving apparatus and a home appliance including the same, more particularly, the motor driving apparatus and a home appliance including the same capable of reducing noise while reducing switching loss, when the inverter is switched.

2. Background

A motor driving apparatus is an apparatus for driving a motor including a rotor which rotates in motion and a stator around which a coil is wound.

Meanwhile, the motor driving apparatus may be divided into a sensor type motor driving apparatus using a sensor and a sensorless type motor driving apparatus.

Recently, for manufacturing cost reduction, the sensorless type motor driving motor is widely used, and thus, various researches on efficient motor driving has been conducted.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

As used herein, the suffixes "module" and "unit" are added or used interchangeably to facilitate preparation of this specification and are not intended to suggest distinct meanings or functions. Accordingly, the terms "module" and "unit" may be used interchangeably.

Meanwhile, s motor driving apparatus 200 according to an embodiment of the present disclosure may be referred to as a motor driver.

Figure 1:
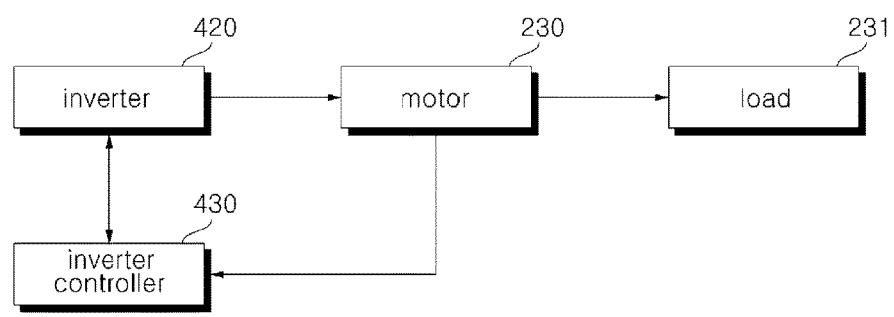
FIG. 1 is a block diagram showing an example of a motor driving apparatus according to an embodiment of the present disclosure.
Figure 2:
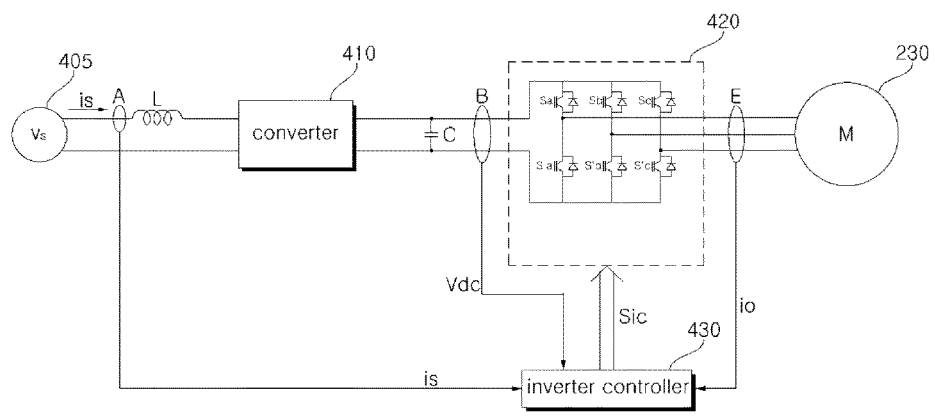
FIG. 2 is a circuit diagram showing an example of the motor driving apparatus of FIG. 1.

FIG. 1 is a block diagram showing an example of a motor driving apparatus according to an embodiment of the present disclosure, and FIG. 2 is a circuit diagram showing an example of the motor driving apparatus of FIG. 1.

Referring to the FIG. 1-2, the motor driving apparatus 220 according to the embodiment of the present disclosure drives a motor in a sensorless manner and may include an inverter 420 and an inverter controller 430.

Further, the motor driving apparatus 220 according to the embodiment of the present disclosure may include a converter 410, a dc link voltage detector B, a smoothing capacitor C and an output current detector E. In addition, the motor driving apparatus 220 may further include an input current detector A, a reactor L, etc.

Meanwhile, the inverter controller 430 in the motor driving apparatus 220 according to the embodiment of the present disclosure, may control the switching elements in the inverter 420 based on a space vector-based pulse width variable control, and control a turn-on time for at least one three-phase switching element of three-phase upper arm switching elements (Sa,Sb,Sc) to be shifted. Accordingly, the current flowing into the capacitor disposed in the dc stage can be reduced.

Accordingly, heats generated in the capacitor disposed in the dc stage can be reduced, and stability in capacitor elements would be enhanced.

Accordingly, capacitance of the capacitor can be reduced. Thus, the manufacturing cost and the like can be reduced.

Particularly, it is available to use a small capacity of dc stage capacitor C, which is called capacitorless.

Hereinafter, an operation of elements of the motor driving apparatus 220 of FIGS. 1 and 2 will be described.

The reactor L is disposed between a commercial AC power 405, having a voltage Vs and the converter 410 to perform power factor correction and boosting operation. In addition, the reactor L may perform a function for limiting harmonic current by high-speed switching.

The input current detector A may detect input current is from the commercial AC power 405. To this end, a current transformer (CT), a shunt resistor, etc. may be used as the input current detector A. The detected input current is may be input to the inverter controller 430 as a pulse type discrete signal.

The converter 410 may convert the AC voltage of the commercial AC power 405 passing through the reactor L into a DC voltage. Although a single-phase AC power is shown as the commercial AC power 405 in the figure, a three-phase AC power may be used. The internal structure of the converter 410 may be changed according to type of the commercial AC power 405.

Meanwhile, the converter 410 may include a diode without a switching element and perform rectification operation without performing separate switching operation.

For example, in a single-phase AC power source, four diodes may be used in the form of a bridge, in a three-phase AC power source, six diodes may be used in the form of a bridge.

Meanwhile, as the converter 410, for example, a half-bridge type converter in which two switching elements and four diodes are connected may be used, and in the case of a three-phase AC power source, six switching elements and six diodes may be used. In this case, the converter 410 may be referred to as a rectifier.

When the converter 410 includes a switching element, it is possible to perform boosting operation, power factor improvement and DC voltage conversion by switching operation of the switching element.

The dc single capacitor C smooths the input power supplied and stores them. In the figure, one element is exemplified by the dc-stage capacitor C, but a plurality of elements is provided, thereby ensuring the element stability.

Meanwhile, in the figure, it is exemplified that it is connected to an output terminal of the converter 410, but it is not limited thereto, DC power can be input directly. For example, when a direct current power from solar cell is directly input to the dc-stage capacitor C, or is input by converting it into DC/DC. Hereinafter, the portions illustrated in the drawings will be mainly described.

Meanwhile, both ends of the dc-stage capacitor C may be referred to as a dc-stage or a dc-link stage since a DC power source is stored.

The dc-stage voltage detector B can detect the dc-stage voltage Vdc at both ends of the dc-stage capacitor C. To this end, the dc voltage detector B may include a resistance element, an amplifier, and the like. The detected dc voltage source Vdc may be input to the inverter controller 430 as a discrete signal in the form of a pulse.

The inverter 420 may include a plurality of inverter switching elements and convert the dc voltage Vdc smoothed by on/off operation of the switching elements into three-phase AC voltages va, vb and vc having a predetermined frequency and output the three-phase AC voltages to the three-phase synchronous motor 230.

The inverter 420 includes upper arm switching elements Sa, Sb, and Sc and lower arm switching elements S'a, S'b, and S'c, each pair of an upper arm switching element and a lower arm switching element being connected in series and three pairs of upper and lower arm switching elements Sa and S'a, Sb and S'b, and Sc and S'c being connected in parallel. Diodes may be connected in anti-parallel to the respective switching elements Sa, S'a, Sb, S'b, Sc, and S'c.

The switching elements of the inverter 420 perform on/off operation based on an inverter switching control signal Sic from the inverter controller 430. Thus, the three-phase AC voltages having the predetermined frequency are output to the three-phase synchronous motor 230.

The inverter controller 430 may control switching operation of the inverter 420 in a sensorless manner. To this end, the inverter controller 430 may receive output current idc detected by the output current detector E.

The inverter controller 430 outputs the inverter switching control signal Sic to the inverter 420 in order to control switching operation of the inverter 420. The inverter switching control signal Sic is generated and output based on the output current idc detected by the output current detector E, as a pulse width modulation (MWM) switching control signal. Detailed operation for outputting the inverter switching control signal Sic from the inverter controller 430 will be described with reference to FIG. 3.

The output current detector E may detect output current idc flowing in the three-phase motor 230.

The output current detector E, as shown in the figure, may be disposed between the dc link capacitor C and the inverter 420 to detect current flowing in the motor.

The output current detector E may include three resistance elements as shown in the figure. It is possible to detect phase currents (ia, ib, ic) which are output currents (io) flowing through the motor 230 through the three resistive elements. The detected output currents (ia, ib, ic) can be applied to the inverter controller 430 as a discrete signal in the form of pulses, and the switching control signal Sic is generated, based on the detected output currents ia, ib, ic.

Meanwhile, in the present specification, the output currents ia, ib, ic, or io are used in combination.

Meanwhile, unlike the figure, the output current detecting section E may include two resistance elements. The phase currents of the remaining phases can be calculated using three-phase equilibrium.

Meanwhile, unlike the figure, the output current detection unit E is disposed between the dc short-circuit capacitor C and the inverter 420 and includes a single shunt resistor Rs and may detect the current flowing through the motor 230. This method can be called one-shunt method.

According to the one-shunt method, the output current detector E uses one shunt resistor element Rs, and thus may detect the phase current which is the output current (idc) flowing through the motor 230 in time division, upon turning on the lower arm switching element of the inverter 420.

The detected output current idc may be applied to the inverter controller 430 as a pulse type discrete signal, and the inverter switching control signal Sic may be generated based on the detected output current idc.

Meanwhile, the three-phase motor 230 includes a stator and a rotor, and thus an AC voltage of each phase, which has the predetermined frequency, is applied to the coil of the stator of each phase a, b or c to rotate the rotor.

The motor 230 may include a surface-mounted permanent-magnet synchronous motor (SMPMSM), an interior permanent magnet synchronous motor (IMPSM) and a synchronous reluctance motor (SYNRM), for example. The SMPMSM and the IPMSM are permanent magnet synchronous motors (PMSMs) using a permanent magnet and the Synrm does not include a permanent magnet.

Figure 3:
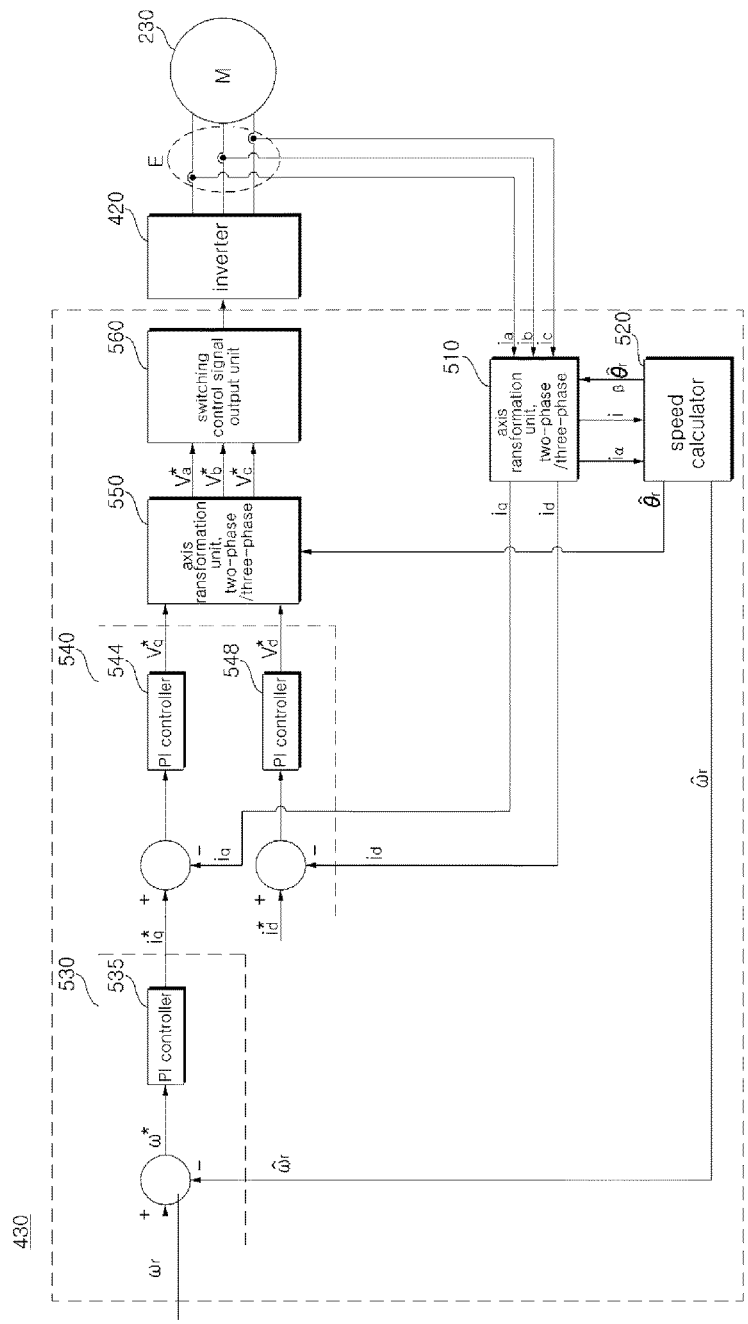
FIG. 3 is a block diagram showing an inverter controller of FIG. 2.

FIG. 3 is a block diagram showing the inverter controller of FIG. 2.

Referring to FIG. 3, the inverter controller 430 may include an axis transformation unit 310, a speed calculator 320, a current command generator 330, a voltage command generator 340, an axis transformation unit 350 and a switching control signal output unit 360.

The axis transformation unit 310 may extract three-phase currents ia, ib, ic from the output current idc detected by the output current detector E and transform the extracted phase currents ia, ib, ic into two-phase currents iα and iβ of a stationary coordinate system.

Meanwhile, the axis transformation unit 310 may transform two-phase currents iα and iβ of the stationary coordinate system into two-phase currents id and iq of a rotating coordinate system.

The speed calculator 320 may estimate a position $\hat{\theta}$, based on the output current ia, ib, ic detected by the output current detector E, differentiate the estimated position and calculate a speed $\hat{\omega}$.

Meanwhile, the current command generator 330 generates a current command value $i^*_q$ based on the calculated speed $\hat{\omega}$, and a speed command value $\hat{\omega}$. For example, the current command generator 330 may perform PI control in a PI controller 335 based on a difference between the calculated speed ω̂, and the speed command value ω̂, and generate the current command value i*$_q$. Although a q-axis current command value i'$_q$ is shown as the current command value in the figure, a d-axis current command value i*$_d$ may also be generated unlike the figure. Meanwhile, the value of the d-axis current command value i*d may be set to 0.

Meanwhile, the current command generator 330 may further include a limiter (not shown) for limiting the level of the current command value i*$_q$ not to exceed an allowable range.

Next, the voltage command generator 340 generates d-axis and q-axis voltage command values V*$_d$ and v*$_q$ based on the d-axis and q-axis currents i$_d$ and i$_q$ transformed into the two-phase rotating coordinate system by the axis transformation unit and the current command values i*$_d$ and i*$_q$ from the current command generator 330. For example, the voltage command generator 340 may perform PI control in the PI controller 344 based on a difference between the q-axis current i$_q$ and the q-axis current command i*$_q$ and generate a q-axis voltage command value v*$_q$. In addition, the voltage command generator 340 may perform PI control in the PI controller 348 based on a difference between the d-axis current id and the d-axis current command i*$_d$ and generate a d-axis voltage command value v*$_d$. Meanwhile, the voltage command generator 340 may further include a limiter (not shown) for limiting the level of the d-axis and q-axis voltage command values v*$_d$ and v*$_q$ not to exceed an allowable range.

Meanwhile, the generated d-axis and q-axis voltage command values v*$_d$ and v*$_q$ are input to the axis transformation unit 350.

The axis transformation unit 350 receives the position θ̂, calculated by the speed calculator 320 and the d-axis and q-axis voltage command values v*$_d$ and v*$_q$ and performs axis transformation.

First, the axis transformation unit 350 transforms a two-phase rotating coordinate system into a two-phase stationary coordinate system. At this time, the position θ̂, calculated by the speed calculator 320 may be used.

Further, the axis transformation unit 350 transforms a two-phase stationary coordinate system into a three-phase stationary coordinate system. Through such transformation, the axis transformation unit 1050 outputs three-phase output voltage command values v*a, v*b and v*c.

The switching control signal output unit 360 generates and outputs an inverter switching control signal Sic according to a pulse width modulation (PWM) method based on the three-phase output voltage command values v*a, v*b and v*c.

The output inverter switching control signal Sic may be converted into a gate drive signal by a gate driver (not shown) and input to the gate of each switching element of the inverter 420. Accordingly, the switching elements Sa, S'a, Sb, S'b, Sc and S'c of the inverter 420 may perform switching operation.

Meanwhile, the switching control signal output unit 360 may control the switching elements in the inverter based on a space vector-based pulse width variable control, control a turn-on time to be shifted and thus output the inverter switching control signal Sic, by which continuous first and second switching periods can be changed to one switching period.

Meanwhile, the switching control signal output unit 360 may output the inverter switching control signal Sic, by which the first and second switching periods are to be changed to one switching period, while controlling the switching element of any one of the three-phase switching elements in the inverter to be continuously turned on or turned off, during the first and second switching periods.

Meanwhile, the switching control signal output unit 360 may output the inverter switching control signal Sic, by which the first and second switching periods includes a symmetrical interval in which the turn-on time for the switching element of the first phase of the three-phase switching elements is symmetrical.

Meanwhile, the switching control signal output unit 360 may output the inverter switching control signal Sic, which delays the turn-on time for the switching element of the first phase of the three-phase switching elements within the first switching period, and advances the turn-on time within the second switching period.

Meanwhile, the switching control signal output unit 360 may output the inverter switching control signal Sic, by which third and fourth switching periods subsequent to the first and second switching periods include an asymmetrical interval in which the turn-on time for the switching element of the first phase of the three-phase switching elements is asymmetrical.

Meanwhile, the switching control signal output unit 360 may output the inverter switching control signal Sic, which delays the turn-on time for the first switching period and advances the turn-on time for the second switching period, for the switching vector having the smallest amplitude among three-phase switching vectors, when the switching element of any one of the three-phase switching elements in the inverter 420 is continuously turned on.

Meanwhile, the switching control signal output unit 360 may output the inverter switching control signal Sic, which delays the turn-on time for the first switching period and advances the turn-on time for the second switching period, for the switching vector having the second largest amplitude among three-phase switching vectors, when the switching element of any one of the three-phase switching elements in the inverter 420 is continuously turned on.

Meanwhile, the switching control signal output unit 360 may output the inverter switching control signal Sic, which delays the turn-on time for the first switching period and advances the turn-on time for the second switching period, for the switching vector having the largest amplitude among three-phase switching vectors, when the switching element of any one of the three-phase switching elements in the inverter 420 is continuously turned off.

Meanwhile, the switching control signal output unit 360 may output the inverter switching control signal Sic, which delays the turn-on time for the first switching period and advances the turn-on time for the second switching period, for the switching vector having the second largest amplitude among three-phase switching vectors, when the switching element of any one of the three-phase switching elements in the inverter 420 is continuously turned off.

Meanwhile, the switching control signal output unit 360 may output the inverter switching control signal Sic, by which the first and second switching periods include a symmetrical interval, and third and fourth switching periods include an asymmetric interval, based on the voltage vector position.

Meanwhile, the switching control signal output unit 360 may output the inverter switching control signal Sic, by which the first and second switching periods include a symmetrical interval, and third and fourth switching periods include an asymmetric interval.

Meanwhile, the switching control signal output unit 360 may output the inverter switching control signal Sic, by which generates a voltage command value based on the output current flowing in the motor, determines a voltage vector position based on the voltage command value, and the first and second switching periods include a symmetrical interval, and third and fourth switching periods include an asymmetric interval, based on the voltage vector position.

FIG. 4A to 4D are diagrams showing various examples of switching vectors for driving an inverter.

Figure 4A:
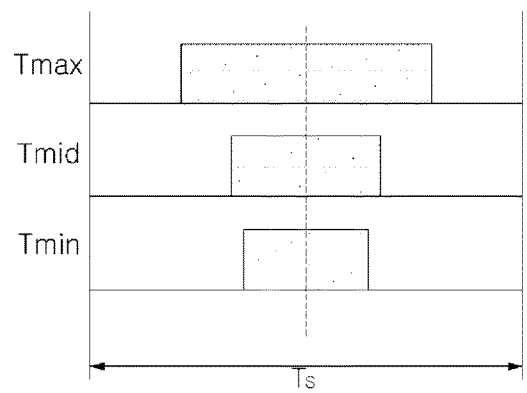
FIG. 4A-4D is a diagram illustrating various example of switching vectors for driving an inverter.

First, FIG. 4A illustrates a three-phase switching vector Tmax, Tmid, Tmin generated by a space vector technique.

Referring to the figure, during the switching period Ts, the turn-on times of the three-phase switching vectors Tmax, Tmid, and Tmin can be illustrated as shown in the figure.

Meanwhile, according to the turn-on time of the three-phase switching vector Tmax, Tmid, and Tmin as shown in FIG. 4A, the three-phase switching elements Sa, Sb, Sc, or S'a, S'B, S'c in the inverter 420 in FIG. 2 should both turn on and off within the switching period.

Accordingly, a switching loss occurs in all three-phase switching elements Sa, Sb, Sc, or S'a, S'b and S'c.

Figure 4B:
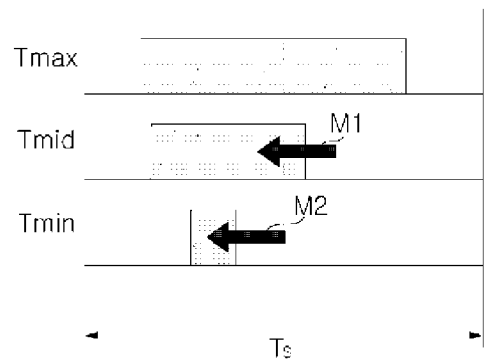

In order to reduce the switching loss, a randomized pulse position (RPP) technique may be applied as shown in FIG. 4B.

That is, a technique of shifting the turn-on time of Tmid, Tmin among the three-phase switching vectors Tmax, Tmid, Tmin can be applied. In particular, it is possible to match the turn-on point of Tmid with the turn-on point of Tmax. Accordingly, although some switching losses are reduced, an amount of operation of the inverter controller 430 is greatly increased due to the turn-on time shift in the switching period, and there is an issue that the switching loss reduction effect is not so great.

Therefore, a Discontinuous PWM (DPWM) technique can be used, in which reduction in switching loss is predominant. That is, as shown in FIGS. 4C and 4D, the switching vector of any one of the three-phase switching vectors is not switched, but can be continuously turned on (Tmax in FIG. 4C) or turned off (Tmin in FIG. 4D) during the switching period.

Accordingly, since switching is performed only in the switching elements of two phases among the three-phase switching elements, the switching loss can be reduced by about 30%.

Figure 4C:
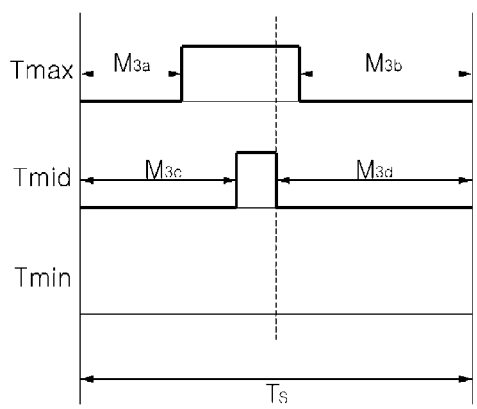
Figure 4D:
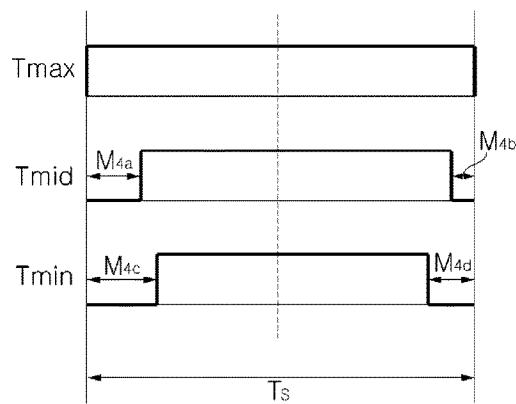

However, as shown in FIGS. 4C and 4D, when the DPWM technique is used, a ripple of the phase current increases, thereby increasing the number of high frequency components. Further, due to such high frequency components, noise is occurred.

In particular, noise is occurred due to a high frequency component proportional to the switching frequency corresponding to the switching period.

Accordingly, the present disclosure proposes a technique for reducing noise while switching loss is reduced when the inverter is switched.

This will be described with reference to FIG. 5 to FIG. 17.

Figure 5:
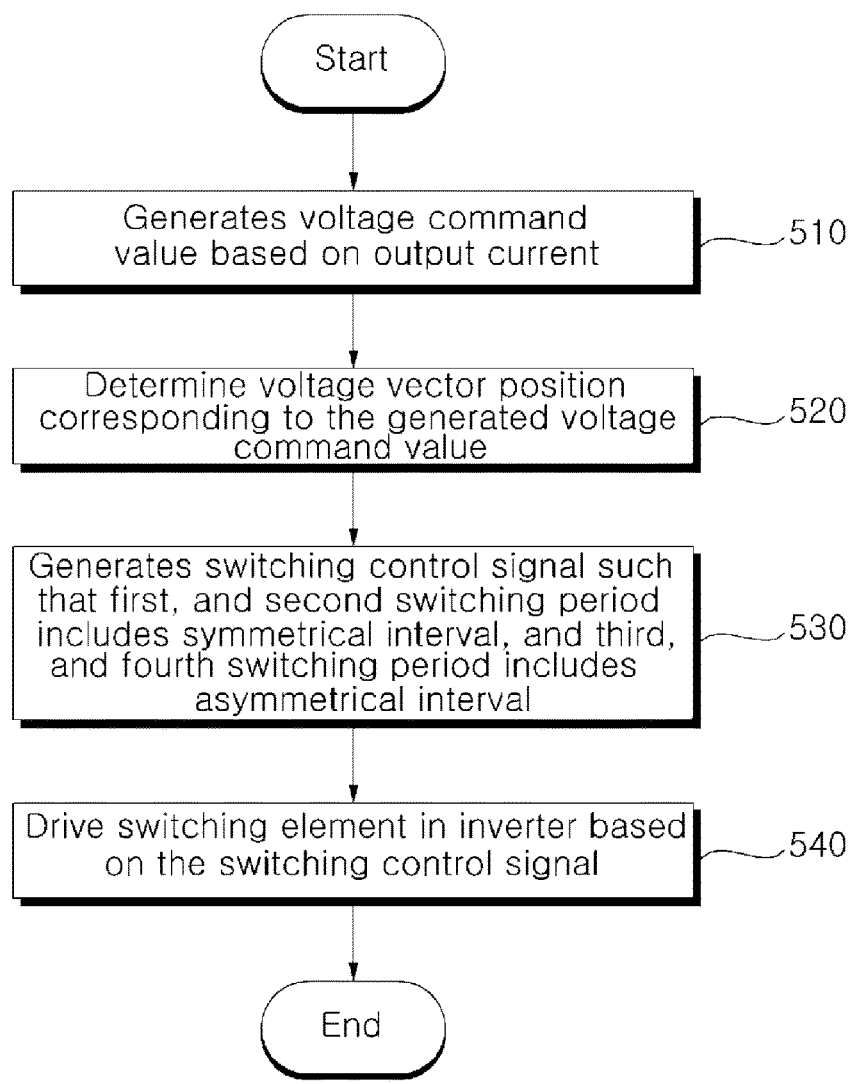
FIG. 5 is a flow chart of describing an driving method of a motor driving apparatus according to an embodiment of the present disclosure.

FIG. 5 is a flowchart illustrating a driving method of a motor driving apparatus according to an embodiment of the present disclosure.

Referring to the figure, the output current detection unit E in the motor driving apparatus 220 detects an output current io flowing through the motor 230 and outputs the detected output current io to the inverter controller 430.

The inverter controller 430 generates a voltage command value based on the output current io from the output current detection unit E (S510).

As described in FIG. 3, the inverter controller 430 calculates a speed of the motor 230, based on the output current io from the output current detection unit E, generates a current command value for driving the motor 230, based on the calculated speed and generates a voltage command value, based on the generated current command value.

Next, the inverter controller 430 determines the voltage vector position corresponding to the generated voltage command value (S520).

Then, the inverter controller 430 generates the inverter switching control signal Sic, by which the first and second switching periods include a symmetrical interval, and third and fourth switching periods include an asymmetric interval, based on the voltage vector position (S530).

Then, the inverter controller 430 outputs the generated inverter switching control signal Sic.

That is, the motor driving apparatus 220 in accordance with an embodiment of the present disclosure comprises a DC-stage capacitor C to store DC power, three-phase upper arm and lower arm switching element, and further comprises an inverter 420 to convert the DC power from the DC-stage capacitor C to an AC power by a switching operation and output the converted AC power to a motor, and an inverter controller 430 to control the inverter 420, wherein the inverter controller 430 controls the switching elements in the inverter 420 based on a space vector-based pulse width variable control, and controls a turn-on time to be shifted such that continuous first and second switching periods can be changed to one switching period.

That is, the turn-on time of the switching vector is shifted so that the switching period becomes one half. Accordingly, noise due to high frequency switching is reduced to around one half. Thus it is possible to reduce switching loss and reduce noise.

In detail, the inverter controller 430 controls, by the DPWM technique, the first and second switching periods are to be changed to one switching period, while controlling the switching element of any one of the three-phase switching elements in the inverter to be continuously turned on or turned off, during the first and second switching periods.

Particularly, the inverter controller 430 controls, by the DPWM technique, the first and second switching periods are to be changed to one switching period, while controlling the switching element of any one of the three-phase switching elements in the inverter to be continuously turned on or turned off, when driving the motor 230 at the same speed, during the first and second switching periods.

Accordingly, by the DPWM technique, switching loss is reduced and noise caused by the frequency switching is reduced to about one half, by changing switching period. Thus it is possible to reduce switching loss and reduce noise.

Meanwhile, the inverter controller 430 may shift the turn-on time such that the first and second switching periods includes a symmetrical interval in which the turn-on time for the switching element of the first phase of the three-phase switching elements is symmetrical.

Meanwhile, the inverter controller 430 may delay the turn-on time for the switching element of the first phase of the three-phase switching elements within the first switching period, and advance the turn-on time within the second switching period.

Meanwhile, the inverter controller 430 may shift the turn-on time such that third and fourth switching periods subsequent to the first and second switching periods include an asymmetrical interval in which the turn-on time for the switching element of the first phase of the three-phase switching elements is asymmetrical.

Meanwhile, the inverter controller 430 may determine whether the switching element of any one of the three-phase switching elements in the inverter 420 is to be continuously turned on or turned off, based on an amplitude of the output current io.

Meanwhile, the inverter controller 430 may delay the turn-on time for the first switching period and advance the turn-on time for the second switching period, for the switching vector having the smallest amplitude among three-phase switching vectors, when the switching element of any one of the three-phase switching elements in the inverter is continuously turned on.

Particularly, the inverter controller 430 may delay the turn-on time for the first switching period and advance the turn-on time for the second switching period, for the switching vector having the second largest amplitude among three-phase switching vectors, when the switching element of any one of the three-phase switching elements in the inverter 420 is continuously turned on.

Meanwhile, the inverter controller 430 may delay the turn-on time for the first switching period and advance the turn-on time for the second switching period, for the switching vector having the largest amplitude among three-phase switching vectors, when the switching element of any one of the three-phase switching elements in the inverter 420 is continuously turned off.

Particularly, the inverter controller 430 may delay the turn-on time for the first switching period and advance the turn-on time for the second switching period, for the switching vector having the second largest amplitude among three-phase switching vectors, when the switching element of any one of the three-phase switching elements in the inverter is continuously turned off.

Meanwhile, the inverter controller 430 may generate a voltage command value based on the output current io flowing in the motor 230, determine a voltage vector position based on the voltage command value, and control the first and second switching periods to include a symmetrical interval, and third and fourth switching periods to include an asymmetric interval, based on the voltage vector position.

In detail, the inverter controller 430 may control first and second switching periods to include a symmetrical interval for at least one of the three-phase switching vectors and third and fourth switching periods to include an asymmetric interval to include an asymmetrical interval for two switching vectors excluding one which does not perform switching, of the three-phase switching vectors.

Particularly, the inverter controller 430 may control the third and fourth switching periods to include an asymmetrical interval, when accelerating, or de accelerating a speed of the motor 230, for the third the third and fourth switching periods.

Meanwhile, the motor driving apparatus 220 in accordance with another embodiment of the present disclosure, comprises a DC-stage capacitor C to store DC power, and a three-phase upper arm and lower arm switching element, and further comprises an inverter 420 to convert the DC power from the DC-stage capacitor to an AC power by a switching operation and output the converted AC power to a motor, and an inverter controller 430 controls first and second switching periods to include a symmetrical interval, and third and fourth switching periods to include an asymmetric interval, and thus is capable of reducing switching loss and noise.

Particularly, a reduction in the switching loss and noise due to a high frequency switching can be implemented at the same time.

Meanwhile, the driving method of FIG. 5 will be described with reference to FIGS. 6A to 11F.

FIGS. 6A to 11F are diagrams referred to in the description of the driving method of FIG. 5.

Figure 6A:
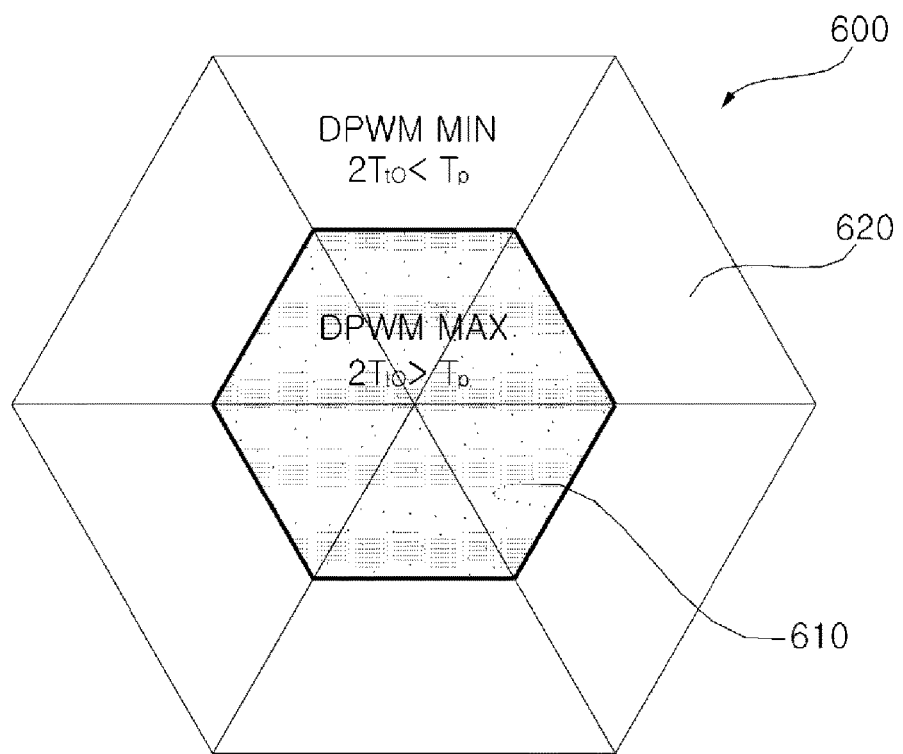
FIG. 6A-11F is a diagram to be referred to describing the driving method in FIG. 5.

First, FIG. 6A shows a space vector area 600.

Meanwhile, in the present disclosure, the inverter controller 430 may determine that the switching element of any one of the three-phase switching elements in the inverter 420 is to be continuously turned on or turned off.

For example, when two times of the turn-on time Tto of the switching vector is greater than a sampling time Tp (2Tto>Tp), that is, when the voltage vector is in a first region 610, the DPWM MAX technique may be applied, in which the switching element of any one of the three-phase switching elements in the inverter 420 is continuously turned on.

Meanwhile, when two times of the turn-on time Tto of the switching vector is less than a sampling time Tp (2Tto<Tp), that is, when the voltage vector is in a second region 620, the DPWM MIN technique may be applied, in which the switching element of any one of the three-phase switching elements in the inverter 420 is continuously turned off.

Figure 6B:
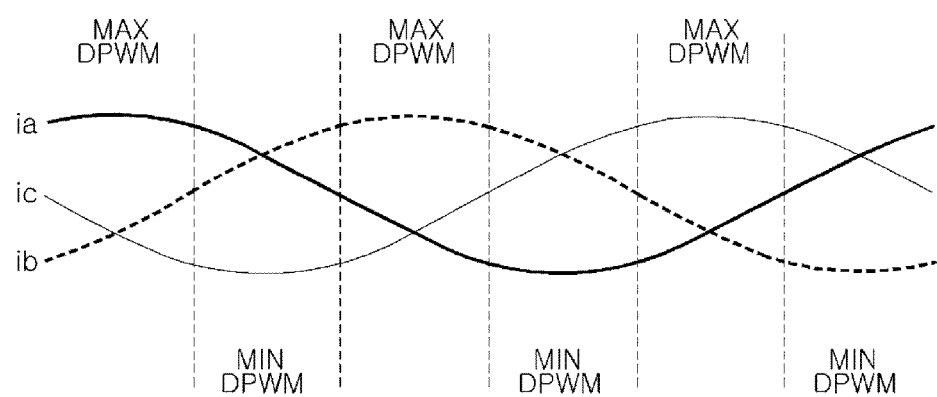

Meanwhile, FIG. 6B shows a phase current flowing from the inverter 420 to the motor 230, particularly, shows the three-phase current ia, ib, ic, and illustrates the DPWM MAX duration, of a waveform of the three-phase current ia, ib, ic, that is a duration for continuously turning on the switching element of any one of the three-phase switching elements in the inverter 420, the DPWM MIN duration, that is a duration for continuously turning off the switching element of any one of the three-phase switching elements in the inverter 420.

Figure 6C:
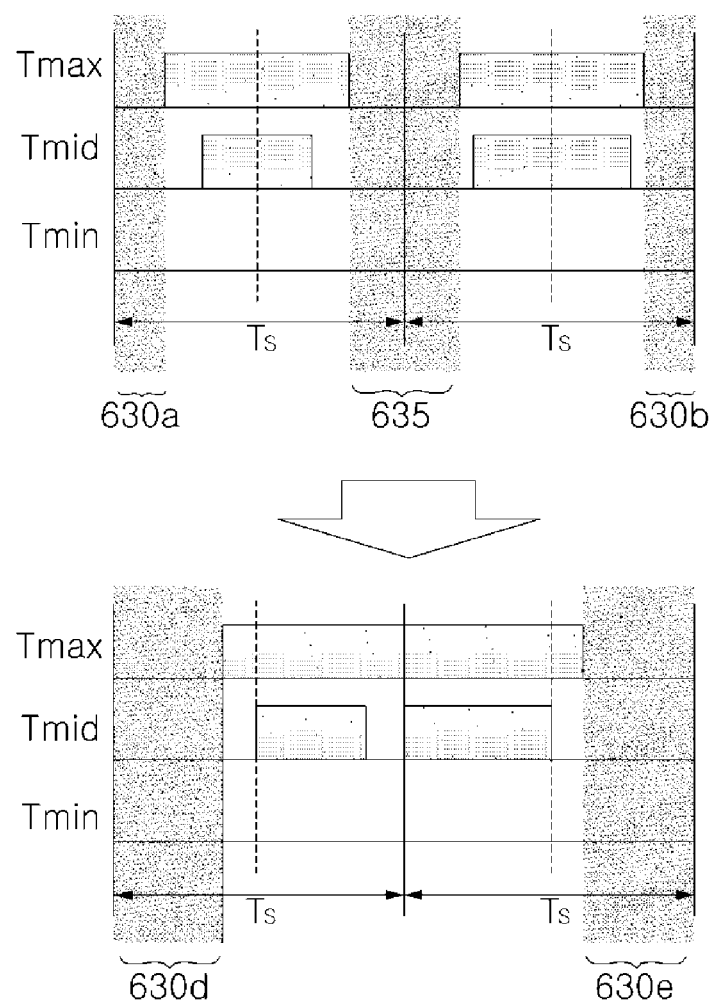

FIG. 6C illustrates that the DPWM MIN is applied and thus the Tmin vector of two continuous switching periods Ts and Ts is zero and the switching element is continuously turned off.

At this time, it is exemplified that the zero vector durations 630a, 635, and 630b are arranged being distributed prior to the switching vector shift. Accordingly, switching losses can be occurred in multiple times.

At this time, the switching vector shift according to the present disclosure is applied and thus Tmax switching vector among the switching vectors Tmax, Tmid, Tmin may be delayed and shifted to the right within the first switching period and advanced and shifted to the left within the second switching period. Accordingly, the shifted Tmax vector can be symmetric about the boundary between the first switching period and the second switching period. Accordingly, noise due to high frequency switching can be reduced.

In addition, the zero vector regions 630d and 630e are disposed at both ends of the first and second switching periods, and thus the switching loss can be reduced.

Figure 6D:
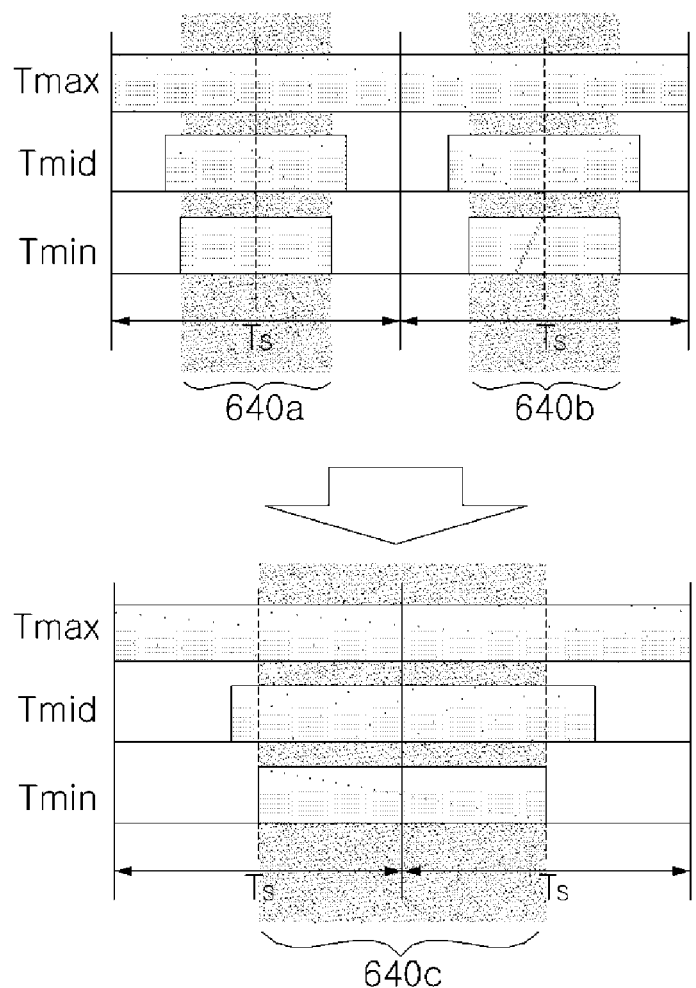

FIG. 6D illustrates that the DPWM MAX is applied and thus illustrates that the switching element is continuously turned on for two continuous switching periods Ts and Ts.

At this time, it is exemplified that the zero vector durations 640a, and 640b are arranged being distributed prior to the switching vector shift. Accordingly, switching losses can be occurred.

At this time, the switching vector shift according to the present disclosure is applied and thus Tmid, and Tmin switching vector among the switching vectors Tmax, Tmid, Tmin may be delayed and shifted to the right within the first switching period and advanced and shifted to the left within the second switching period. Accordingly, the shifted Tmid and Tmin vector can be symmetric about the boundary between the first switching period and the second switching period. Accordingly, noise due to high frequency switching can be reduced.

In addition, the zero vector sections 640c is disposed around the center of first and second switching periods, and thus the switching loss can be reduced.

Figure 7A:
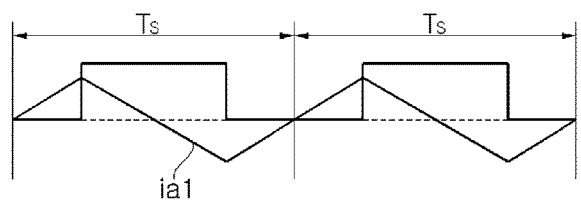
Figure 7B:
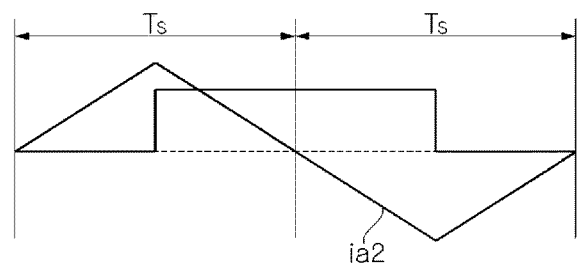

FIG. 7A illustrates a phase current ia1 flowing for two switching periods Ts and Ts and FIG. 7B illustrates a phase current ia2 flowing for two switching periods Ts and Ts.

FIG. 7A illustrates a case where a vector shift as in the present disclosure is not performed, and FIG. 7B illustrates a case where a vector shift is performed, as in the present disclosure, and thus two switching periods are moved as one switching period.

Accordingly, it can be seen that the frequency of the phase current in FIG. 7B is one half of that of the phase current in FIG. 7A, and thus noise occurrence due to high frequency switching is reduced.

Figure 8A:
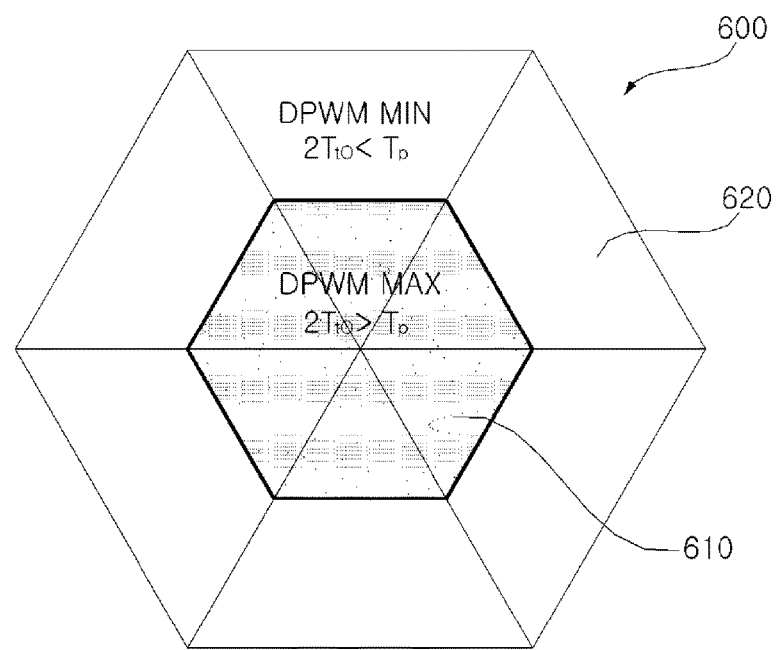

FIG. 8A illustrates a space vector area 600 including a first region 610 and a second region 620, as in FIG. 6A.

The inverter controller 430 may determine whether the switching element of any one of the three-phase switching elements in the inverter 420 is to be continuously turned on or turned off, based on the voltage vector position.

For example, when two times of the turn-on time Tto of the switching vector is greater than a sampling time Tp (2Tto>Tp), that is, when the voltage vector is in the first region 610, the DPWM MAX technique may be applied, in which the switching element of any one of the three-phase switching elements in the inverter 420 is continuously turned on.

Figure 8B:
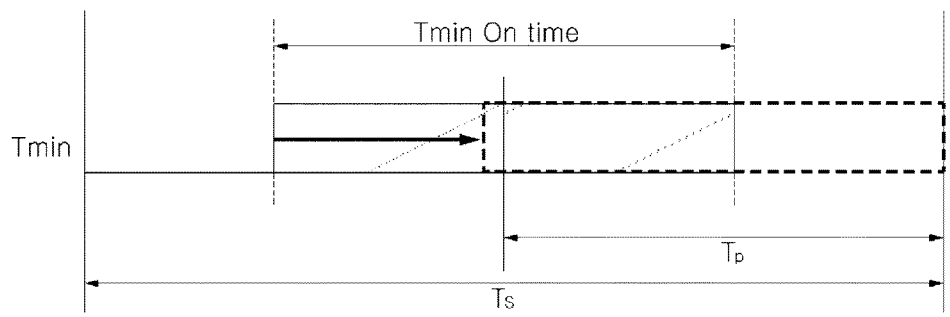

FIG. 8B illustrates when the turn-on time Tto of the switching vector Tmin is greater than a half of sampling time Tp/2, and thus the turn-on time of the switching vector Tmin is delayed, and shifted to the right, within the first switching period.

Meanwhile, when two times of the turn-on time Tto of the switching vector is greater than a sampling time Tp (2Tto<Tp), that is, when the voltage vector is in the second region 620, the DPWM MIN technique may be applied, in which the switching element of any one of the three-phase switching elements in the inverter 420 is continuously turned off.

Figure 8C:
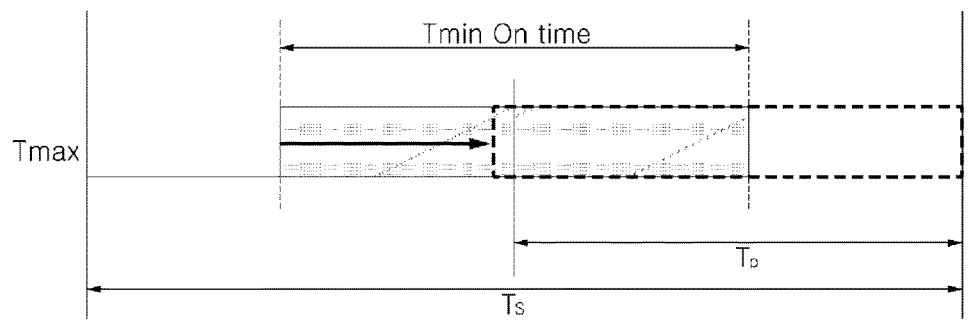

FIG. 8C illustrates when the turn-on time Tto of the switching vector Tmax is greater than a half of sampling time Tp/2, and thus the turn-on time of the switching vector Tmax is delayed, and shifted to the right, within the first switching period.

Figure 9A:
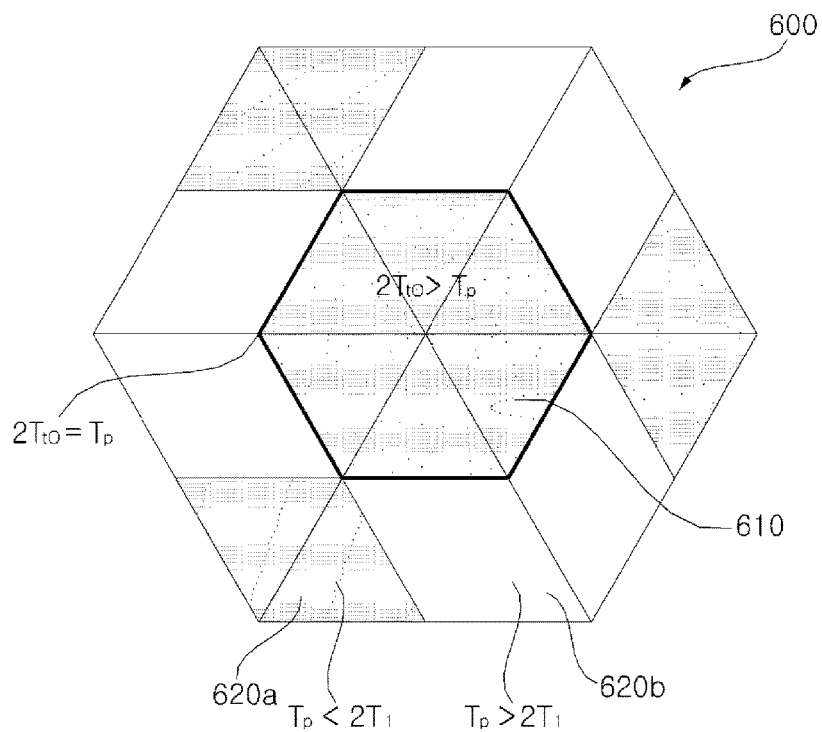

FIG. 9A illustrates a space vector area 600 including a first region 610 and a second region 620, as in FIG. 6A.

Particularly, FIG. 9A illustrates a region where Tp>2T1 is determined, of the second region 620 in FIG. 6A.

Figure 9B:
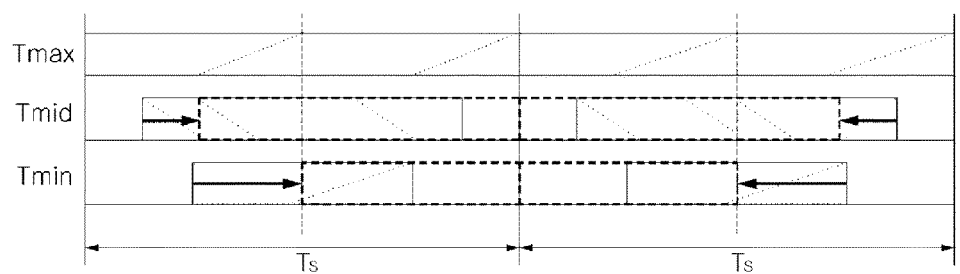
Figure 9C:
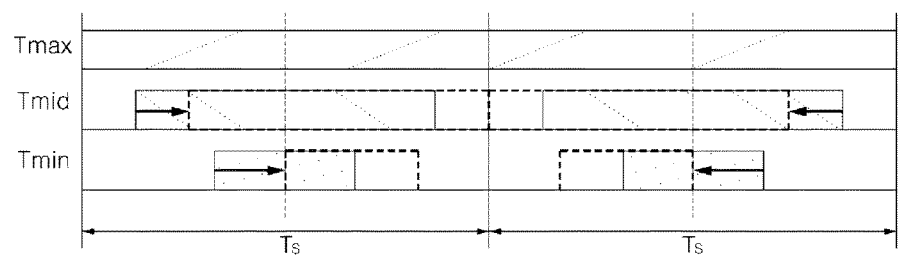
Figure 9D:
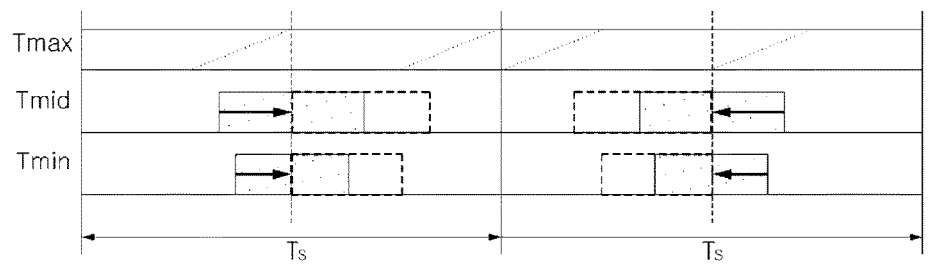

Meanwhile, FIG. 9B to FIG. 9D illustrates that the DPWM MAX is applied in which the switching element corresponding to the Tmax switching vector of the three-phase switching elements in the inverter 420 is continuously turned on.

First, in case of FIG. 9B, it is when the voltage vector position is in the second region 620, and the inverter controller 430 may control the Tmid switching vector, and the Tmin switching vector corresponding to the first one of the first and second switching periods to be delayed and shifted to the right, and the Tmid switching vector, and the Tmin switching vector corresponding to the second one to be advanced and shifted to the left.

Accordingly, a symmetrical region may be occurred, where the Tmid switching vector, and the Tmin switching vector is symmetrical around the boundary of the first and second switching period, within the first and second switching period.

That is, the first and second switching period may include a symmetrical region associated with the turn-on time, by shifting the switching vector. Particularly, according to FIG. 9B, the turn-on time of the Tmin and Tmid switching vector is still continuous even at the boundary of the first and second switching period, and thus a number of switching is reduced, thereby switching loss would be reduced. Further, reduction effect in the switching period is occurred, and thus noise can be reduced.

Next, in the case of FIG. 9C, it is when the voltage vector position is in the region 620a which is Tp>2T1, and the inverter controller 430 may control the Tmid switching vector, and the Tmin switching vector corresponding to the first one of the first and second switching periods to be delayed and shifted to the right, and the Tmid switching vector, and the Tmin switching vector corresponding to the second one to be advanced and shifted to the left.

Accordingly, a symmetrical region may be occurred, where the Tmid switching vector, and the Tmin switching vector is symmetrical around the boundary of the first and second switching period, within the first and second switching period.

That is, the first and second switching period may include a symmetrical region associated with the turn-on time, by shifting the switching vector. Particularly, according to FIG. 9C, the turn-on time of the Tmid switching vector is still continuous even at the boundary of the first and second switching period, and thus a number of switching is reduced, thereby switching loss would be reduced. Further, reduction effect in the switching period is occurred, and thus noise can be reduced.

Next, in case of FIG. 9D, it is when the voltage vector position is in the region 620b which is Tp<2T1, and the inverter controller 430 may control the Tmid switching vector, and the Tmin switching vector corresponding to the first one of the first and second switching periods to be delayed and shifted to the right, and the Tmid switching vector, and the Tmin switching vector corresponding to the second one to be advanced and shifted to the left.

Accordingly, a symmetrical region may be occurred, where the Tmid switching vector, and the Tmin switching vector is symmetrical around the boundary of the first and second switching period, within the first and second switching period.

That is, the first and second switching period may include a symmetrical region associated with the turn-on time, by shifting the switching vector.

Particularly, according to FIG. 9D, the turn-on time is not still continuous even at the boundary of the first and second switching period, and thus reduction effect in noise due to reduction in the switching period is weak, compared with FIG. 9B.

Figure 10A:
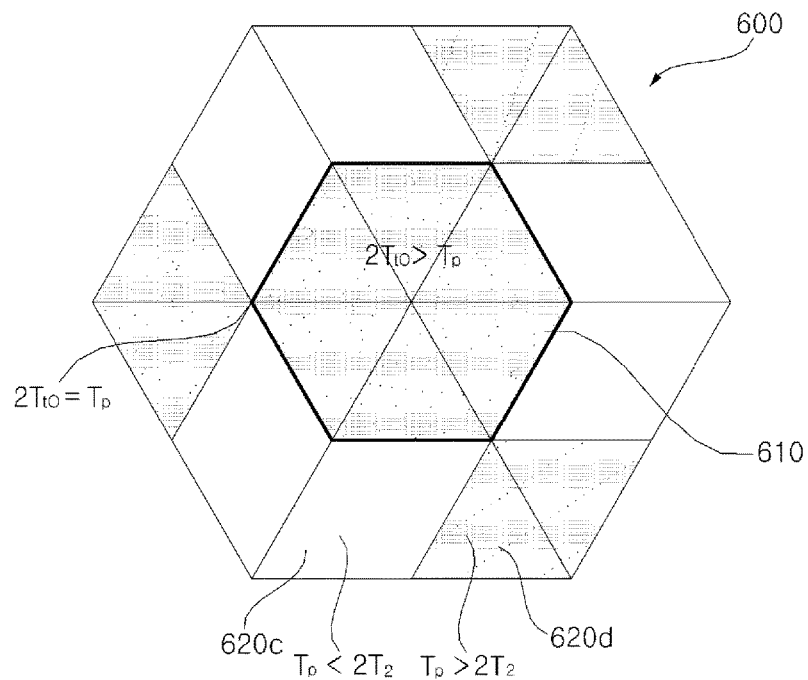

FIG. 10A illustrates a space vector area 600 including the first region 610, similar to FIG. 6A.

Particularly, FIG. 10A illustrates a region 620a which is Tp<2T2, of the second region 620.

Figure 10B:
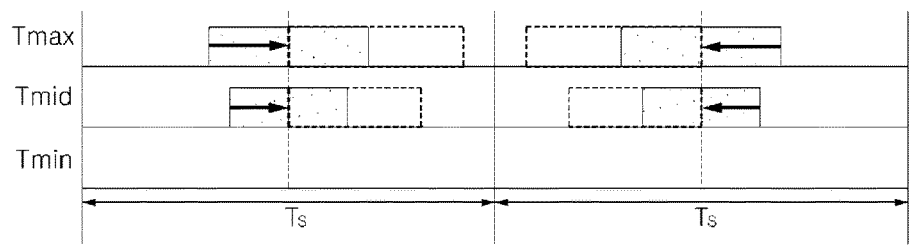
Figure 10C:
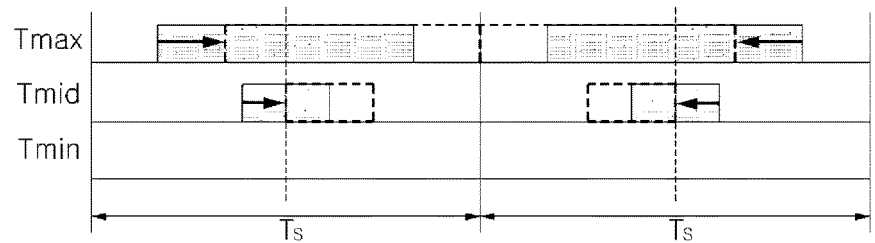
Figure 10D:
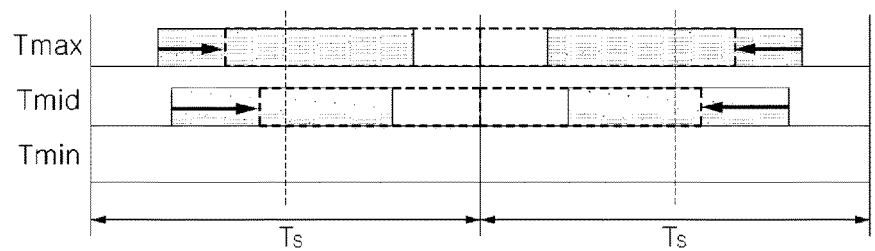

Meanwhile, FIG. 10B to FIG. 10D illustrates that the DPWM MIN is applied in which the switching element corresponding to the Tmin switching vector of the three-phase switching elements in the inverter 420 is continuously turned on.

First, in case of FIG. 10B, it is when the voltage vector position is in the second region 620, and the inverter controller 430 may control the Tmid switching vector, and the Tmax switching vector corresponding to the first one of the first and second switching periods to be delayed and shifted to the right, and the Tmid switching vector, and the Tmax switching vector corresponding to the second one to be advanced and shifted to the left.

Accordingly, a symmetrical region may be occurred, where the Tmid switching vector, and the Tmax switching vector is symmetrical around the boundary of the first and second switching period, within the first and second switching period.

Meanwhile, according to FIG. 10B, the turn-on time is not still continuous even at the boundary of the first and second switching period, and thus reduction effect in noise due to reduction in the switching period would be weak.

Next, in case of FIG. 10C, it is when the voltage vector position is in the region 620c which is Tp>2T2, and the inverter controller 430 may control the Tmid switching vector, and the Tmax switching vector corresponding to the first one of the first and second switching periods to be delayed and shifted to the right, and the Tmid switching vector, and the Tmax switching vector corresponding to the second one to be advanced and shifted to the left.

Accordingly, a symmetrical region may be occurred, where the Tmid switching vector, and the Tmax switching vector is symmetrical around the boundary of the first and second switching period, within the first and second switching period.

That is, the first and second switching period may include a symmetrical region associated with the turn-on time, by shifting the switching vector. Particularly, according to FIG. 10C, the turn-on time of the Tmax switching vector is still continuous even at the boundary of the first and second switching period, and thus a number of switching is reduced, thereby switching loss would be reduced. Further, reduction effect in the switching period is occurred, and thus noise can be reduced.

Next, in case of FIG. 10D, it is when the voltage vector position is in the region 620d which is Tp<2T2, and the inverter controller 430 may control the Tmid switching vector, and the Tmax switching vector corresponding to the first one of the first and second switching periods to be delayed and shifted to the right, and the Tmid switching vector, and the Tmax switching vector, corresponding to the second one to be advanced and shifted to the left.

Accordingly, a symmetrical region may be occurred, where the Tmid switching vector, and the Tmax switching vector is symmetrical around the boundary of the first and second switching period, within the first and second switching period.

That is, the first and second switching period may include a symmetrical region associated with the turn-on time, by shifting the switching vector.

Particularly, according to FIG. 10D, the turn-on time of the Tmax, and Tmid switching vector is still continuous even at the boundary of the first and second switching period, and thus a number of switching is reduced, thereby switching loss would be reduced. Further, reduction effect in the switching period is occurred, and thus noise can be reduced.

Figure 11A:
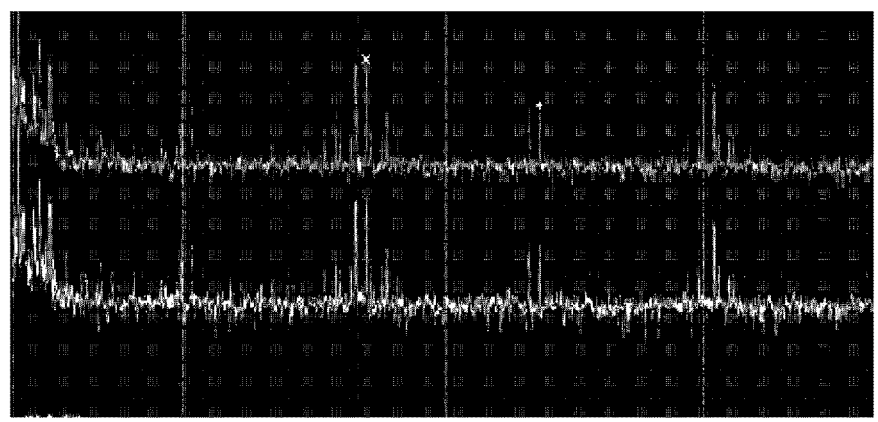
Figure 11B:
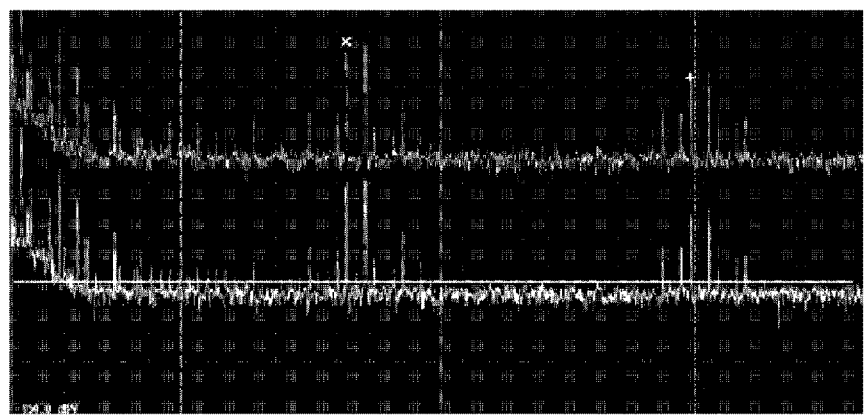
Figure 11C:
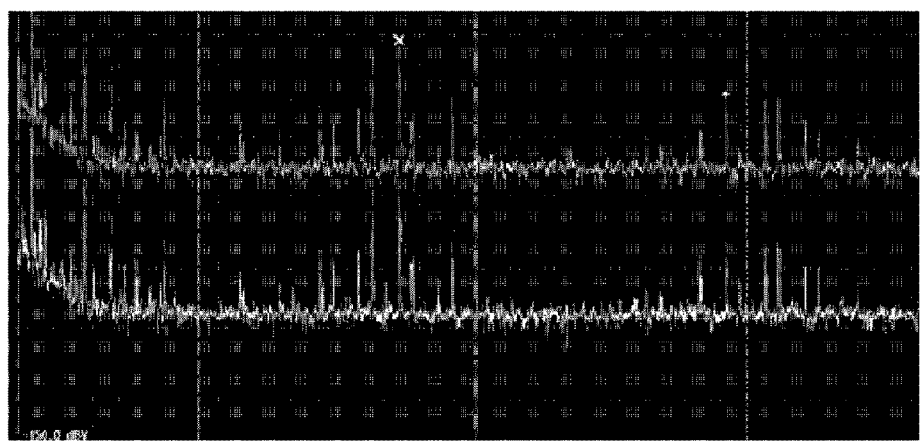
Figure 11D:
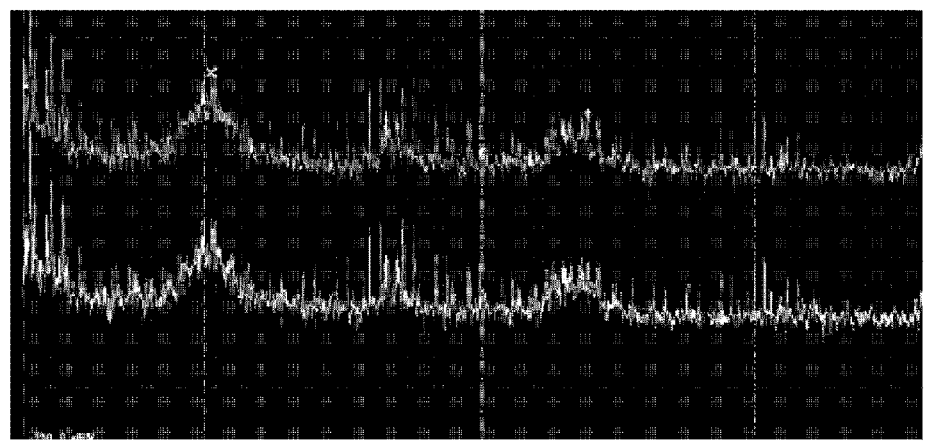
Figure 11E:
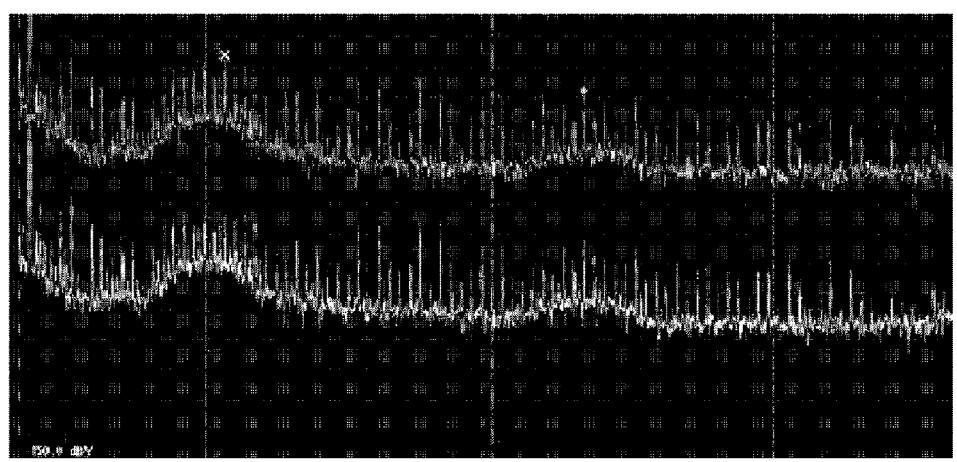

FIG. 11A to 11C illustrates a various example of a waveform of the phase current, when the DPWM MIN technique, and the vector shift technique in the present disclosure, and FIG. 11D to 11E illustrates a various example of a waveform of the phase current by the DPWM technique which the vector shift technique in the present disclosure is not used.

Comparing FIG. 11A with FIG. 11D, it is a waveform of the phase current when its frequency is 19 Hz, the waveform of the phase current in FIG. 11A is stable and its peak is smaller. Accordingly, based on the waveform of the phase current in FIG. 11A, it can be shown that reduction in switching loss and noise is decreased.

Comparing FIG. 11B with FIG. 11E, it is a waveform of the phase current when its frequency is 36 Hz, the waveform of the phase current in FIG. 11B is stable and its peak is smaller. Accordingly, based on the waveform of the phase current in FIG. 11B, it can be shown that reduction in switching loss and noise is decreased.

Figure 11F:
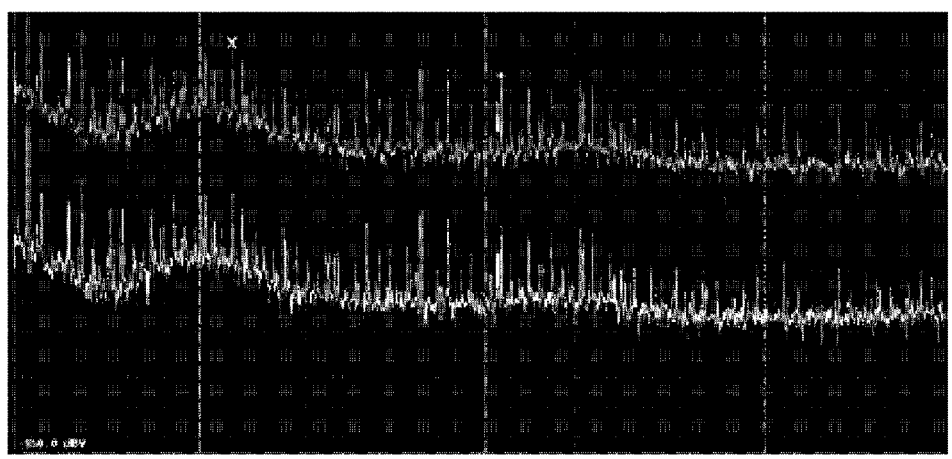

Comparing FIG. 11C with FIG. 11F, it is a waveform of the phase current when its frequency is 50 Hz, the waveform of the phase current in FIG. 11B is stable and its peak is smaller. Accordingly, based on the waveform of the phase current in FIG. 11C, it can be shown that reduction in switching loss and noise is decreased.

Meanwhile, the motor driving apparatus 220 described above can be applied to various electronic apparatuses. For example, it can be applied to a laundry processing device, an air conditioner, a refrigerator, a water purifier, a cleaner, a vehicle, a robot, a drone, and the like in a home appliance. Hereinafter, various examples of home appliances applicable to the motor driving apparatus 220 will be described.

Figure 12:
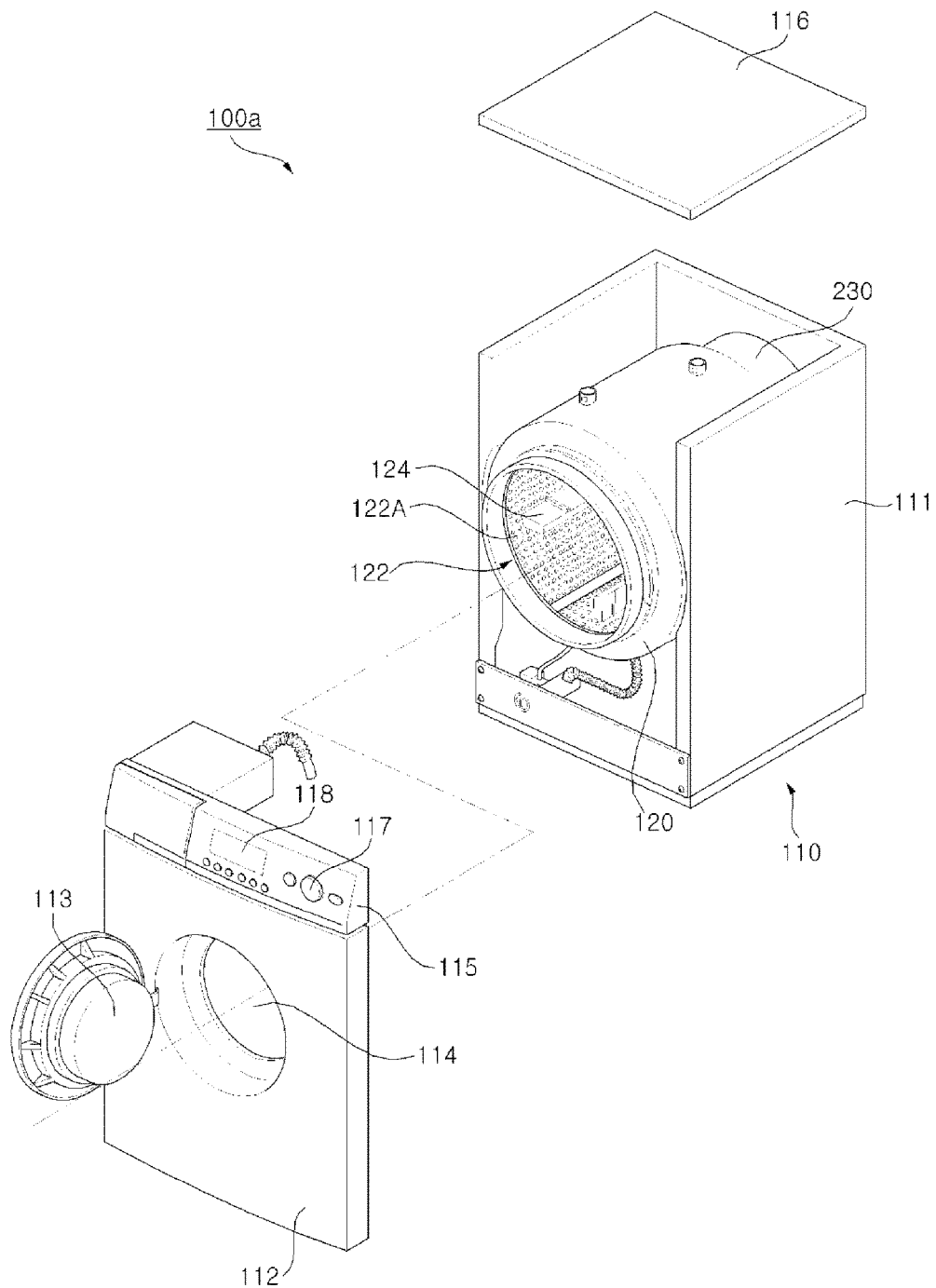
FIG. 12 is a perspective view showing a laundry treatment machine which is an example of a home appliance according to an embodiment of the present disclosure.

FIG. 12 is a perspective view showing a laundry treatment machine according to an embodiment of the present disclosure.

Referring to the figure, the laundry treatment machine 100 a according to the embodiment of the present disclosure is a front load type laundry treatment machine in which laundry is inserted into a drum in a front direction. The front load type laundry treatment machine includes a washing machine for washing and rinsing laundry or a dryer for drying laundry, hereinafter, the washing machine will be focused upon.

The laundry treatment machine 100a of FIG. 12 is a drum type laundry treatment machine, which includes a cabinet 110 forming an appearance of the laundry treatment machine 100 a, a tub 120 provided in the cabinet 110 and supported by the cabinet 110, a drum 122 which is provided in the tub 120 and in which laundry is washed, a motor 130 for driving the drum 122, a washing water supply device (not shown) provided outside a cabinet body 111 to supply washing water into the cabinet 110, and a drainage device (not shown) formed at the lower side of the tub 120 to drain washing water.

A plurality of openings 122A is formed in the drum 122 to pass washing water and a lifter 124 may be provided on the inner surface of the drum 122 such that laundry is lifted up to a predetermined height and then is dropped by gravity.

The cabinet 110 includes the cabinet body 111, a cabinet cover 112 provided on a front surface of the cabinet body 111 to be coupled to the cabinet body, a control panel 115 provided above the cabinet cover 122 to be coupled to the cabinet body 111, and a top plate 116 provided above the control panel 115 to be coupled to the cabinet body 111.

The cabinet cover 112 includes a laundry inlet 114, through which laundry is put into and taken out of the washing machine, and a door 113 rotatably provided such that the laundry inlet 114 is opened or closed.

The control panel 115 includes operation keys 117 for controlling an operation state of the laundry treatment machine 100 a and a display 118 provided at one side of the operation keys 117 to display the operation state of the laundry treatment machine 100a.

The operation keys 117 and the display 118 of the control panel 115 are electrically connected to a controller (not shown) and the controller (not shown) electrically controls the components of the laundry treatment machine 100a. Operation of the controller (not shown) will be described later.

Meanwhile, the drum 122 may include an auto balance (not shown). The auto balance (not shown) reduces vibrations generated according eccentricity of laundry contained in the drum 122 and may be implemented by a liquid balance, a ball balance, etc.

Meanwhile, not shown in the figure, the laundry treatment machine 100 a may further include a vibration sensor for measuring vibrations of the drum 122 or vibrations of the cabinet 110.

Figure 13:
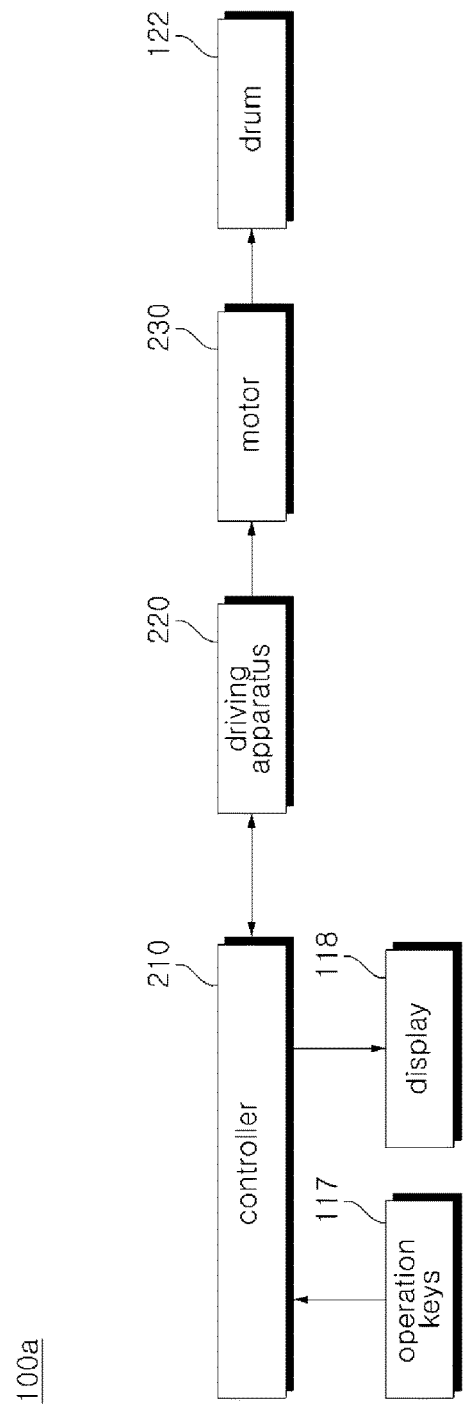
FIG. 13 is a block diagram showing the internal configuration of the laundry treatment machine of FIG. 12.

FIG. 13 is a block diagram showing the internal configuration of the laundry treatment machine of FIG. 12.

Referring to the figure, in the laundry treatment machine 100 a, the driver 220 is controlled by control operation of the controller 210 and the driver 220 drives the motor 230. Therefore, the drum 122 rotates by the motor 230.

The controller 210 may operate according an operation signal from the operation keys 117 so as to perform washing, rinsing and dehydration cycles.

In addition, the controller 210 controls the display 118 so as to display a washing course, a washing time, a dehydration time, a rinsing time, a current operation state, etc.

Meanwhile, the controller 210 controls the driver 220 to drive the motor 230. At this time, a position sensor for sensing the position of the rotor of the motor is not provided inside or outside the motor 230. That is, the driver 220 controls the motor 230 in a sensorless manner.

The driver 220 may drive the motor 230 and may include an inverter (not shown), an inverter controller (not shown), an output current detector (E of FIG. 2) for detecting output current flowing in the motor 230 and an output voltage detector (F of FIG. 2) for detecting the output voltage vo applied to the motor 230. In addition, the driver 220 may further include a converter for supplying a DC voltage to the inverter (not shown).

For example, the inverter controller (430 of FIG. 2) of the driver 220 estimates the position of the rotor of the motor 230 based on the output current idc and the output voltage vo. Further, the inverter controller controls rotation of the motor 230 based on the estimated position of the rotor.

Particularly, when the inverter controller (430 of FIG. 2) generates and outputs a pulse width modulation (PWM) switching control signal (Sic of FIG. 2) to the inverter (not shown) based on the output current idc and the output voltage vo, the inverter (not shown) may perform a high-speed switching operation to supply an AC voltage having a predetermined frequency to the motor 230. Further, the motor 230 rotates by the AC voltage having the predetermined frequency.

Meanwhile, the driver 220 may be corresponded to the motor driver 220 of FIG. 1.

Meanwhile, the controller 210 may sense the amount of laundry based on the output current idc flowing in the motor 230. For example, while the drum 122 rotates, the amount of laundry may be sensed based on the current value idc of the motor 230.

In particular, the controller 210 may accurately sense the amount of laundry using resistance and inductance values of the stator of the motor measured in the motor alignment period, upon sensing the amount of laundry.

Meanwhile, the controller 210 may sense eccentricity of the drum 122, that is, unbalance UB of the drum 122. These eccentricities may be sensed based on a ripple component of the output current idc flowing in the motor 230 or change in rotation speed of the drum 122.

In particular, the controller 210 may accurately sense eccentricity using resistance and inductance values of the stator of the motor measured in the motor alignment period, upon sensing the amount of laundry.

Figure 14:
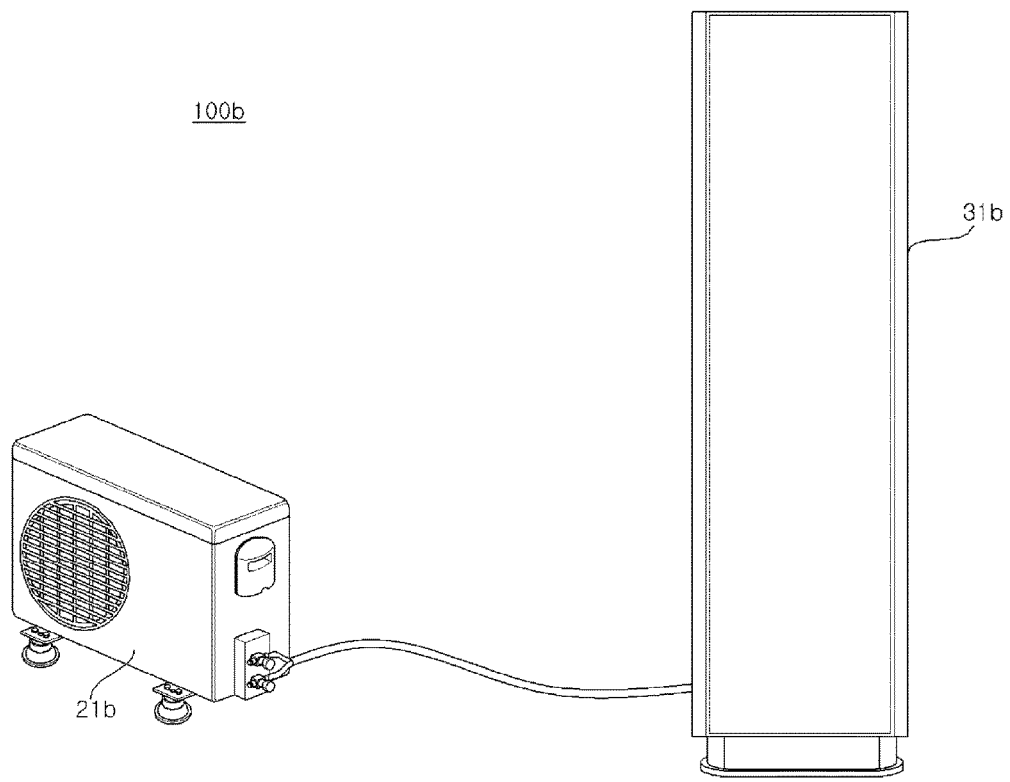
FIG. 14 is a diagram showing the configuration of an air conditioner which is another example of a home appliance according to an embodiment of the present disclosure.

FIG. 14 is a diagram showing the configuration of an air conditioner which is another example of a home appliance according to an embodiment of the present disclosure.

The air conditioner 100b according to an embodiment of the present disclosure may include an indoor unit 31b and an outdoor unit 21b connected to the indoor unit 31b.

The indoor unit 31b of the air conditioner may be any one of stand type, wall mount type, and ceiling type air conditioners. In the figure, the stand type indoor unit 31b is illustrated.

Meanwhile, the air conditioner 100b may further include at least one of a ventilator, an air purifier, a humidifier, and a heater, which may be operatively connected to the indoor unit and the outdoor unit.

The outdoor unit 21b includes a compressor (not shown) for compressing a refrigerant, an outdoor heat exchanger (not shown) for performing heat exchange between the refrigerant and outdoor air, an accumulator (not shown) for extracting a gaseous refrigerant component from the refrigerant and supplying the extracted gaseous refrigerant component to the compressor, and a four-way valve (not shown) for changing a flow path of the refrigerant based on a heating operation. In addition, while the outdoor unit 21b may further include a plurality of sensors, a valve, and an oil collector, descriptions thereof will be omitted herein.

The outdoor unit 21b operates compressors and outdoor heat exchangers included therein to compress the refrigerant or perform heat exchange based on setting conditions and to supply the compressed or heat-exchanged refrigerant to the indoor unit 31b. The outdoor unit 21b may be driven according to demand of a remote control unit (not shown) or the indoor unit 31b. As a cooling/heating capacity of the air conditioner 100b varies based on the indoor unit which is driven, the number of driven outdoor units and the number of driven compressors installed in outdoor units may be changed.

In this case, the outdoor unit 21b supplies the compressed refrigerant to the connected indoor unit 31b.

The indoor unit 31b receives the refrigerant from the outdoor unit 21b to discharge cool or hot air into a room. The indoor unit 31b includes an indoor heat exchanger (not shown), an indoor fan (not shown), an expansion valve (not shown) for expanding the refrigerant, and a plurality of sensors (not shown).

In this case, the outdoor unit 21b and the indoor unit 31b are connected to each other via communication cables to exchange data with each other, and the outdoor unit and the indoor unit are connected to the remote control unit (not shown) by wire or wirelessly to operate under control of the remote control unit (not shown).

A remote controller (not shown) is connected to the indoor unit 31b to allow a user to input a control command for controlling the indoor unit and to receive and display state information on the indoor unit. In this case, the remote controller may communicate with the indoor unit in a wired or wireless manner according to how the remote controller is connected to the indoor unit 31b.

Figure 15:
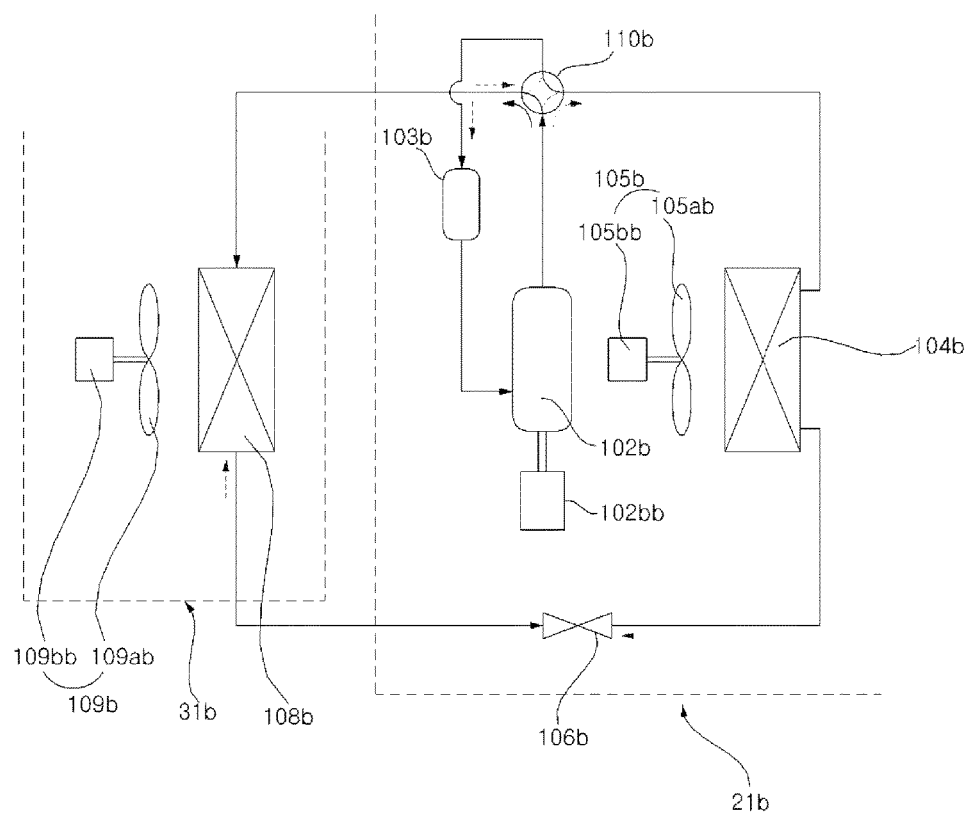
FIG. 15 is a schematic diagram showing an outdoor unit and an indoor unit of FIG. 14.

FIG. 15 is a schematic view of the outdoor unit and the indoor unit shown in FIG. 14.

Referring to FIG. 15, the air conditioner 100b is broadly divided into the indoor unit 31b and the outdoor unit 21b.

The outdoor unit 21b includes a compressor 102b for compressing a refrigerant, a compressor motor 102bb for driving the compressor, an outdoor heat exchanger 104b for dissipating heat from the compressed refrigerant, an outdoor blower 105 including an outdoor fan 105ab disposed at one side of the outdoor heat exchanger 104b to accelerate heat dissipation of the refrigerant and an outdoor fan motor 105bb for rotating the outdoor fan 105ab, an expansion unit 106 for expanding the condensed refrigerant, a cooling/heating switching valve 110b for changing a flow path of the compressed refrigerant, and an accumulator 103b for temporarily storing the gaseous refrigerant to remove moisture and foreign particles from the refrigerant and supplying the refrigerant of predetermined pressure to the compressor.

The indoor unit 31b includes an indoor heat exchanger 109b disposed in a room to perform a cooling/heating function, and an indoor blower 109b including an indoor fan 109ab disposed at one side of the indoor heat exchanger 109b to accelerate heat dissipation of the refrigerant and an indoor fan motor 109 bb for rotating the indoor fan 109ab.

At least one indoor heat exchanger 109b may be installed. At least one of an inverter compressor and a constant speed compressor may be used as the compressor 102b.

In addition, the air conditioner 100b may be configured as a cooler for cooling the room or may be configured as a heat pump for cooling or heating the room.

The compressor 102b of the outdoor unit 21b of FIG. 14 may be driven by the motor driving apparatus for driving the compressor motor 250b shown in FIG. 1.

Alternatively, the indoor fan 109ab or the outdoor fan 105ab may be driven by the motor driving apparatus for driving the indoor fan motor 109 bb and the outdoor fan motor 150bb shown in FIG. 1.

Figure 16:
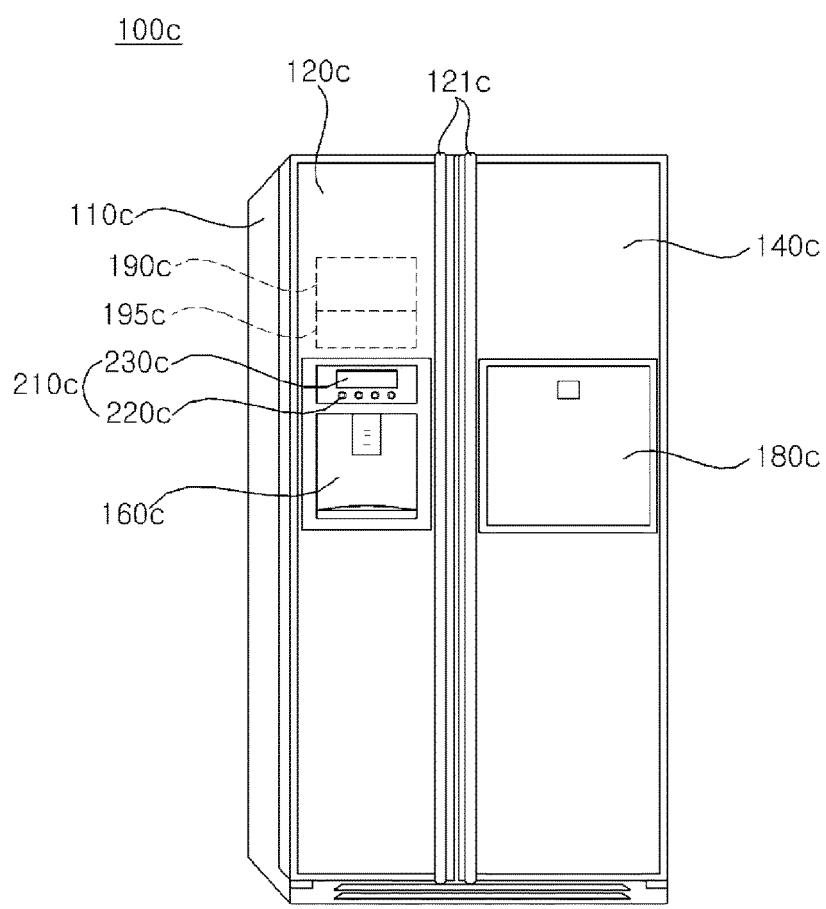
FIG. 16 is a perspective view showing a refrigerator which is another example of a home appliance according to an embodiment of the present disclosure.

FIG. 16 is a perspective view showing a refrigerator which is another example of a home appliance according to an embodiment of the present disclosure.

With reference to the drawing, the refrigerator 100c related to the present disclosure includes a case 110c, which has an inner space divided into a freezing compartment and a refrigerating compartment (not shown in the drawing), a freezing compartment door 120c to shield the freezing compartment, and a refrigerating compartment door 140c to shield the refrigerating compartment, the case 110c and the doors 120c and 140c defining an outer appearance of the refrigerator.

Further, the freezing compartment door 120c and the refrigerating compartment door 140c may be provided at front surfaces thereof with forwardly protruding door handles 121c to assist a user in easily pivoting the freezing compartment door 120c and the refrigerating compartment door 140c by gripping the door handles 121c.

Meanwhile, the refrigerating compartment door 140c may further be provided at a front surface thereof with a so-called home bar 180c that allows the user to conveniently retrieve stored items, such as beverages, without opening the refrigerating compartment door 140c.

Further, the freezing compartment door 120c may further be provided at a front surface thereof with a dispenser 160c that allows the user to easily and conveniently retrieve ice or drinking water without opening the freezing compartment door 120c. The freezing compartment door 120c may further be provided with a control panel 210c at the upper side of the dispenser 160c. The control panel 210c serves to control driving operation of the refrigerator 100c and to display a screen showing a current operating state of the refrigerator 100c.

While the dispenser 160c is shown in the figure as being located at the front surface of the freezing compartment door 120c, the present disclosure is not limited thereto and the dispenser 160c may be located at the front surface of the refrigerating compartment door 140c.

Meanwhile, the freezing compartment (not shown) may accommodate, in an upper region thereof, an icemaker 190c used to make ice using water supplied thereto and cold air within the freezing compartment and an ice bank 195c located under the icemaker 190c to receive ice released from the icemaker 190c. In addition, although not shown in the drawing, an ice chute (not shown) may be used to guide the ice received in the ice bank 195c to fall into the dispenser 160c.

The control panel 210c may include an input unit 220c having a plurality of buttons and a display unit 230c to display control screens, operating states, and the like.

The display unit 230c displays control screens, operating states, and other information, such as an internal temperature of the refrigerator, etc. For example, the display unit 230c may display a service type of the dispenser (ice cubes, water, crushed ice), a set temperature of the freezing compartment, and a set temperature of the refrigerating compartment.

The display unit 230c may be any one of a liquid crystal display (LCD), a light emitting diode (LED), and an organic light emitting diode (OLED) units and the like. In addition, the display unit 230c may be a touch screen that may additionally perform a function of the input unit 220c.

The input unit 220c may include a plurality of operation buttons. For example, the input unit 220c may include a dispenser setting button (not shown) to set a service type of the dispenser (ice cubes, water, crushed ice), a freezing compartment temperature setting button (not shown) to set a temperature of the freezing compartment, and a refrigerating compartment temperature setting button (not shown) to set a temperature of the refrigerating compartment. In addition, the input unit 220c may be a touch screen that may additionally perform a function of the display unit 230c.

Meanwhile, the refrigerator according to embodiments of the present disclosure is not limited to a double door type shown in the drawing, and may be any one of a one door type refrigerator, a sliding door type refrigerator, a curtain door type refrigerator and others.

Figure 17:
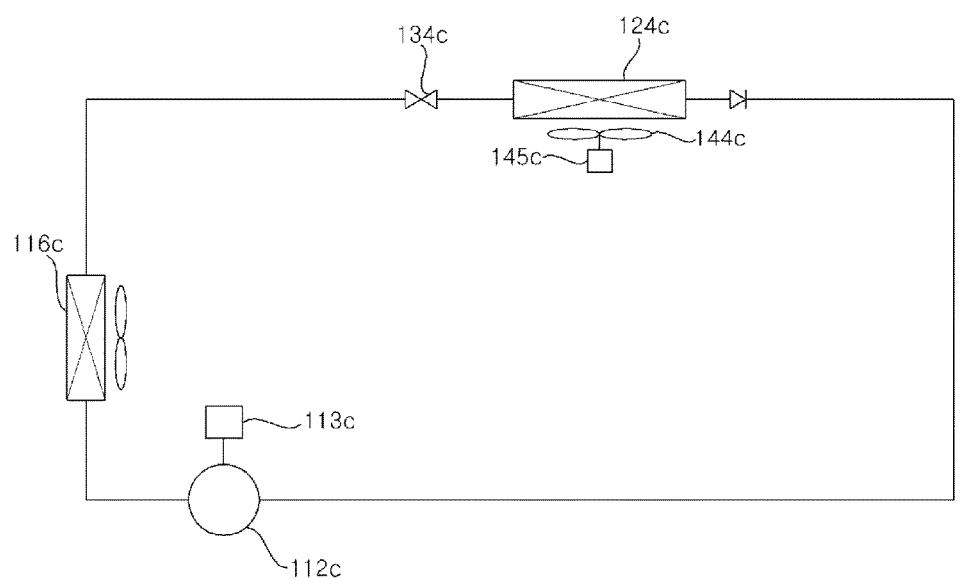
FIG. 17 is a diagram showing the configuration of a refrigerator of FIG. 16

FIG. 17 is a diagram showing the configuration of the refrigerator of FIG. 16.

In explaining with reference to the figure, the refrigerator 100c may include a compressor 112c, a condenser 116c to condense refrigerant compressed in the compressor 112c, a freezing compartment evaporator 124c placed in the freezing compartment (not shown) to evaporate the condensed refrigerant directed from the condenser 116c, and a freezing compartment expansion valve 134c to expand the refrigerant to be directed to the freezing compartment evaporator 124c.

While the drawing shows use of a single evaporator by way of example, evaporators may be respectively placed in the freezing compartment and the refrigerating compartment.

That is, the refrigerator 100c may further include a refrigerating compartment evaporator (not shown) placed in the refrigerating compartment (not shown), a 3-way valve (not shown) to direct the condensed refrigerant from the condenser 116 c to the refrigerating compartment evaporator (not shown) or the freezing compartment evaporator 124c, and a refrigerating compartment expansion valve (not shown) to expand the refrigerant to be directed to the refrigerating compartment evaporator (not shown).

In addition, the refrigerator 100c may further include a gas-liquid separator (not shown) in which the refrigerant having passed through the freezing compartment evaporator 124c is divided into liquid and gas.

In addition, the refrigerator 100c may further include a refrigerating compartment fan (not shown) and a freezing compartment fan 144c, which suction cold air having passed through the freezing compartment evaporator 124c and blow the cold air to the refrigerating compartment (not shown) and the freezing compartment (not shown) respectively.

The refrigerator 100c may further include a compressor drive unit 113c to drive the compressor 112c, a refrigerating compartment fan drive unit (not shown) to drive the refrigerating compartment fan (not shown), and a freezing compartment fan drive unit 145c to drive the freezing compartment fan 144c.

Meanwhile, in the case in which the common evaporator 124c is used in the freezing compartment and the refrigerating compartment as shown in the drawing, a damper (not shown) may be installed between the freezing compartment and the refrigerating compartment, and a fan (not shown) may forcibly blow cold air generated by the single evaporator to the freezing compartment and the refrigerating compartment.

The compressor 112c of FIG. 17 may be driven by the motor driving apparatus for driving the compressor motor shown in FIG. 1.

Alternatively, the refrigerating compartment fan (not shown) and the freezing compartment fan 144c may be driven by the motor driving apparatus for driving the freezing compartment fan motor (not shown) and the freezing compartment fan motor (not shown) shown in FIG. 1.

The motor driving apparatus and the home appliance having the same according to embodiments of the present invention are not limited to configurations and methods of the embodiments described above. Variations may be made to the embodiments described above by selectively combining all or some of the embodiments.

A motor driving method or a method for operating the home appliance according to the present invention is implementable by code which can be read, on a recording medium which can be read by a processor provided to the motor driving apparatus or home appliance, by the processor. The recording medium readable by the processor includes all kinds of recording devices for storing data which can be read by the processor.

As is apparent from the above description, the present invention has the following effects.

According to an embodiment of the present invention, a motor driving apparatus and a home appliance including the same comprises a DC-stage capacitor to store DC power, an inverter including a three-phase upper arm and lower arm switching element, and to convert the DC power from the DC-stage capacitor to an AC power by a switching operation and output the converted AC power to a motor, and a controller to control the inverter, wherein the controller controls the switching elements in the inverter based on a space vector-based pulse width variable control, and controls a turn-on time of the switching elements to be shifted, wherein continuous first and second switching periods of the switching elements is changed to one switching period by shifting the a turn-on time of the switching elements, and thus noise can be reduced while reducing switching loss, when the inverter is switched.

Particularly, reduction in switching loss and noise due to high frequency switching can be implemented at the same time.

According to an another embodiment of the present invention, a motor driving apparatus and a home appliance including the same comprises a DC-stage capacitor to store DC power, an inverter including a three-phase upper arm and lower arm switching element, and to convert the DC power from the DC-stage capacitor to an AC power by a switching operation and output the converted AC power to a motor, and a controller to control the inverter, wherein the controller controls first and second switching periods to include a symmetrical interval, and third and fourth switching periods to include an asymmetric interval, and thus noise can be reduced while reducing switching loss, when the inverter is switched.

Particularly, reduction in switching loss and noise due to high frequency switching can be implemented at the same time.

In the motor driving apparatus and the home appliance having the same according to the embodiment of the present disclosure, the configuration and method of the embodiments described above is not applied in a limited manner, but the embodiments may be configured such that all or some of the embodiments may be selectively combined so that various modifications may be made.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Therefore, the present invention has been made in view of the above problems, and it is an object of the present invention to provide a motor driving apparatus and a home appliance including the same capable of reducing noise while reducing switching loss, when the inverter is switched.

In accordance with an aspect of the present invention, the above and other objects can be accomplished by the provision of a motor driving apparatus comprising a DC-stage capacitor to store DC power, an inverter including a three-phase upper arm and lower arm switching element, and to convert the DC power from the DC-stage capacitor to an AC power by a switching operation and output the converted AC power to a motor, and a controller to control the inverter, wherein the controller controls the switching elements in the inverter based on a space vector-based pulse width variable control, and controls a turn-on time of the switching elements to be shifted, wherein continuous first and second switching periods of the switching elements is changed to one switching period by shifting the a turn-on time of the switching elements.

In accordance with another aspect of the present invention, the above and other objects can be accomplished by the provision of a motor driving apparatus comprising a DC-stage capacitor to store DC power, an inverter including a three-phase upper arm and lower arm switching element, and to convert the DC power from the DC-stage capacitor to an AC power by a switching operation and output the converted AC power to a motor, and a controller to control the inverter, wherein the controller controls first and second switching periods to include a symmetrical interval, and third and fourth switching periods to include an asymmetric interval.

In accordance with another aspect of the present invention, the above and other objects can be accomplished by the provision of a home appliance comprising a motor, and a motor driving apparatus to drive the motor, wherein the motor driving apparatus comprises a DC-stage capacitor to store DC power, an inverter including a three-phase upper arm and lower arm switching element, and to convert the DC power from the DC-stage capacitor to an AC power by a switching operation and output the converted AC power to a motor, and a controller to control the inverter, wherein the controller controls the switching elements in the inverter based on a space vector-based pulse width variable control, and controls a turn-on time of the switching elements to be shifted, wherein continuous first and second switching periods of the switching elements is changed to one switching period by shifting the a turn-on time of the switching elements.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A motor driving apparatus, comprising:
   a direct current (DC)-stage capacitor to store DC power;
   an inverter including three-phase upper arm and lower arm switching elements, the inverter to convert, based on a switching operation, the DC power from the DC-stage capacitor to an alternate current (AC) power, and the inverter to output the converted AC power;
   a controller to control the inverter, wherein the controller is configured to control the switching elements, and the controller is configured to control a turn-on time of the switching elements;
   an output current detector to detect an output current in a motor,
   wherein the controller is configured to:
      provide a voltage command value based on the output current in the motor,
      determine a position of a voltage vector based on the voltage command value,
      when the position of the voltage vector is within a first region of a space vector area and any one of the three-phase switching elements in the inverter is continuously turned on during a first switching period and a second switching period contiguous to the first switching period, control others of the three-phase switching elements in the inverter to shift turn-on time in a direction to a boundary between the first switching period and the second switching period during the first switching period and the second switching period, and control all the three-phase switching elements in the inverter to turn on during a first period including the boundary between the first switching period and the second switching period,
      when the position of the voltage vector is within a second region different from the first region of the space vector area and any one of the three-phase switching elements in the inverter is continuously turned off during the first switching period and the second switching period, control others of the three-phase switching elements in the inverter to shift turn-on time in the direction to the boundary between the first switching period and the second switching period during the first switching period and the second switching period, and control at least one of others of the three-phase switching elements in the inverter to turn on during a second period including the boundary between the first switching period and the second switching period.

2. The motor driving apparatus of claim 1, wherein the controller is configured to:
   shift the turn-on time within the first switching period for the switching element of a first phase of the three-phase switching elements and the turn-on time within the second switching period in the direction to the boundary between the first switching period and the second switching period.

3. The motor driving apparatus of claim 1, wherein the controller is configured to:
   shift a turn-on time for turning on the switching element of a first phase of the three-phase switching elements during the first switching period and the second switching period for the turn-on time of the switching element to be symmetric about the boundary between the first switching period and the second switching period, and
   shift the turn-on time such that third and fourth switching periods include an asymmetrical interval in which the turn-on time for the switching element of a first phase of the three-phase switching elements is asymmetrical, wherein the third and fourth switching periods are subsequent to the first and second switching periods.

4. The motor driving apparatus of claim 1, wherein the controller is configured to determine whether the switching element of any one of the three-phase switching elements is to be turned on or turned off based on an amplitude of the output current.

5. The motor driving apparatus of claim 4, wherein the controller is configured to:
   when the switching element of any one of the three-phase switching elements is turned on, shift the turn-on time for the first switching period and the turn-on time for the second switching period, for a switching vector having a smallest amplitude among three-phase switching vectors, in the direction to the boundary between the first switching period and the second switching period.

6. The motor driving apparatus of claim 5, wherein the controller is configured to:
   when the switching element of any one of the three-phase switching elements is turned on, shift the turn-on time for the first switching period and the turn-on time for the second switching period, for a switching vector having a second largest amplitude among the three-phase switching vectors, in the direction to the boundary between the first switching period and the second switching period.

7. The motor driving apparatus of claim 4, wherein the controller is configured to:
when the switching element of any one of the three-phase switching elements is turned off, shift the turn-on time for the first switching period and the turn-on time for the second switching period, for a switching vector having a largest amplitude among three-phase switching vectors, in the direction to the boundary between the first switching period and the second switching period.

8. The motor driving apparatus of claim 7, wherein the controller is configured to:
when the switching element of any one of the three-phase switching elements is turned off, shift the turn-on time for the first switching period and the turn-on time for the second switching period, for a switching vector having a second largest amplitude among the three-phase switching vectors, in the direction to the boundary between the first switching period and the second switching period.

9. The motor driving apparatus of claim 1,
wherein the controller is configured to:
control the first and second switching periods to include a symmetrical interval, and control third and fourth switching periods to include an asymmetric interval, based on the position of the voltage vector.

10. The motor driving apparatus of claim 1, wherein the inverter to output the converted AC power to a motor.

11. A home appliance comprising:
a motor; and
the motor driving apparatus of claim 1, wherein the motor driving apparatus to drive the motor.

* * * * *